United States Patent
Gabbay

(10) Patent No.: US 9,071,195 B2
(45) Date of Patent: Jun. 30, 2015

(54) METHOD AND SYSTEM FOR SIGNAL SYNTHESIS

(75) Inventor: David Gabbay, Maccabim (IL)

(73) Assignee: SAVANT TECHNOLOGIES LTD., Maccabim (IL)

( * ) Notice: Subject to any disclaimer, the term of this patent is extended or adjusted under 35 U.S.C. 154(b) by 0 days.

(21) Appl. No.: 13/977,804

(22) PCT Filed: Dec. 26, 2011

(86) PCT No.: PCT/IL2011/000965
§ 371 (c)(1),
(2), (4) Date: Aug. 1, 2013

(87) PCT Pub. No.: WO2013/093386
PCT Pub. Date: Jul. 12, 2012

(65) Prior Publication Data
US 2013/0300460 A1    Nov. 14, 2013

Related U.S. Application Data

(60) Provisional application No. 61/429,281, filed on Jan. 3, 2011.

(51) Int. Cl.
*H03B 21/00* (2006.01)
*G06F 1/025* (2006.01)

(52) U.S. Cl.
CPC ............... *H03B 21/00* (2013.01); *G06F 1/025* (2013.01)

(58) Field of Classification Search
CPC ..... H03B 21/02; G06F 1/0328; H04M 1/505; H03L 7/16; H03K 4/026
USPC ......................................... 327/105, 106, 107
See application file for complete search history.

(56) References Cited

U.S. PATENT DOCUMENTS

| | | | |
|---|---|---|---|
| 4,584,658 A | 4/1986 | Ottobre et al. | |
| 4,665,372 A | 5/1987 | Schwartz | |
| 5,063,354 A | 11/1991 | Lauper et al. | |
| 5,332,975 A * | 7/1994 | Young et al. | ................... 327/107 |
| 6,066,967 A | 5/2000 | Cahill et al. | |
| 6,597,208 B1 | 7/2003 | Gabet et al. | |
| 2008/0005213 A1 | 1/2008 | Holtzman | |
| 2011/0199127 A1 | 8/2011 | Turner | |

* cited by examiner

*Primary Examiner* — John Poos
(74) *Attorney, Agent, or Firm* — William H. Dippert; Eckert Seamans Cherin & Mellott, LLC

(57) ABSTRACT

The invention describes methods and systems for digital synthesis of electric signals. According to the invention, one or more bit-patterns are provided, each indicative of a rectangular waveform having a characteristic frequency. Further to determining a selected signal frequency to be synthesized, a selected bit-pattern associated therewith is obtained. Bits of the selected bit-pattern are cyclically serialized to generate a substantially rectangular waveform signal comprising the characteristic frequency. Then, the signal is filtered to suppress spurious frequencies outside a certain unfiltered frequency band which corresponds to the selected bit-pattern to thereby obtain a filtered signal with prominent frequency component corresponding to the selected signal frequency.

14 Claims, 9 Drawing Sheets

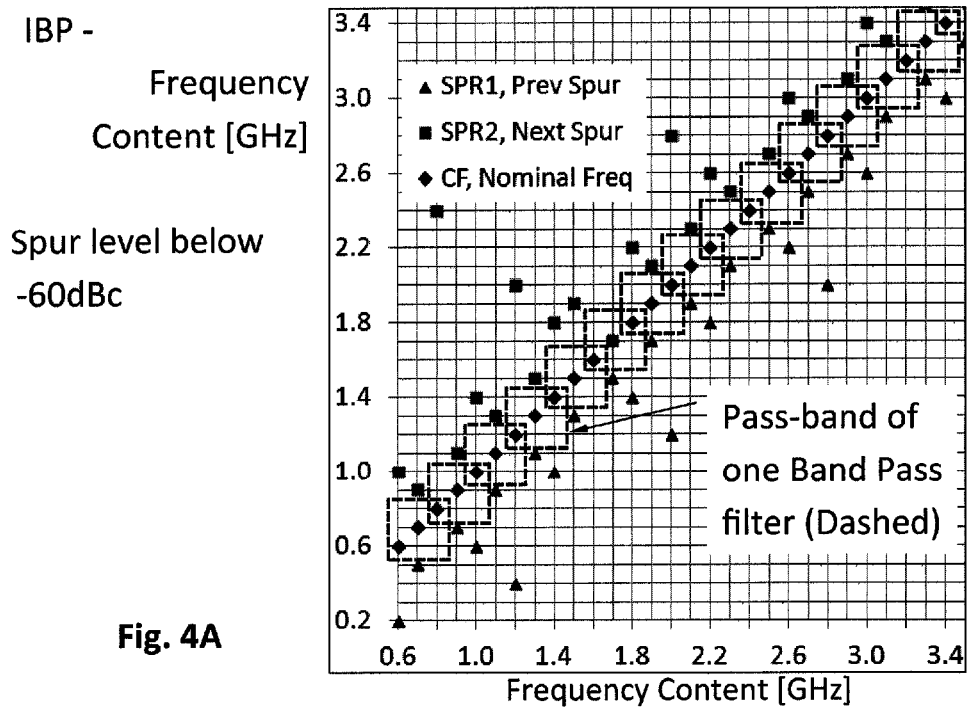
Fig. 4A  IBP - Frequency Content [GHz]  Spur level below -60dBc
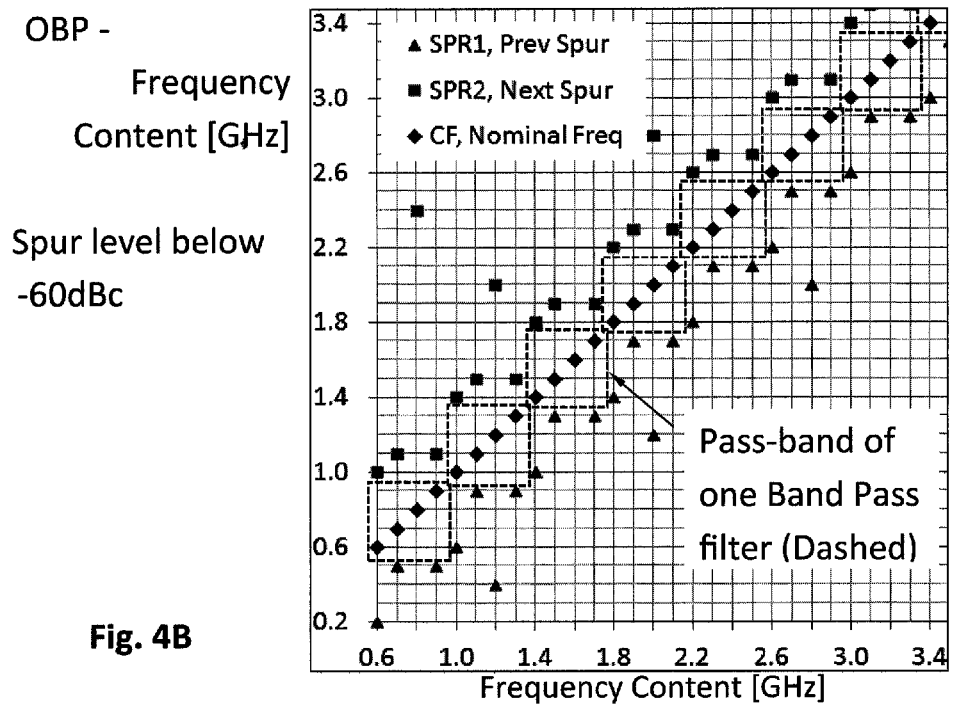
Fig. 4B  OBP - Frequency Content [GHz]  Spur level below -60dBc

METHOD AND SYSTEM FOR SIGNAL SYNTHESIS

CROSS REFERENCE TO RELATED APPLICATIONS

This application is a U.S. National Stage filing of co-pending PCT Patent Application No PCT/IL2011/000965, filed Dec. 26, 2011, which is based upon and claims the benefit of the filing date of U.S. Provisional Patent Application Ser. No. 61/429,281, filed Jan. 3, 2011.

FIELD OF THE INVENTION

The present invention is generally in the field of digital signal synthesis. More particularly, the invention relates to methods and systems for Direct Digital Synthesis of coherent signals.

BACKGROUND OF THE INVENTION

Synthesizers are designed and used to generate signals in a broad spectrum of frequencies while enabling rapid switching between frequencies selected within that spectrum. Traditional analog synthesizers have been replaced by digital synthesizers, which are generically named Direct Digital Synthesizers (DDS). DDS are increasingly used due to low cost, ease of frequency control and the ability to precisely generate signal with an accurate frequency value selected from a set of possible frequencies. There are available DDS that can, for example, generate signals with frequencies in an operational band of 18 GHz and with resolution of 1 Hz.

A DDS signal generator operates by storing in a memory, in a digital format, selected points representative of a complete cycle of a waveform, and recalling stored points from the memory, in a cyclic manner (to replicate a single cycle repeatedly), to generate the wanted waveform. When the stored waveform values are taken from a sinusoidal waveform then the DDS would generate an approximation of a sinusoidal signal. The rate in which the synthesizer completes a complete cycle of the waveform governs the frequency of the generated wave: the faster the synthesizer completes a cycle, the higher the frequency.

Conventional DDS sinusoidal signal generators are based on Phase Accumulator architecture. This DDS architecture includes a phase accumulator (hereinafter called an accumulator) a mapping device and a digital-to analogue converter (DAC). The accumulator provides an output phase-word value x which is periodically increased by a constant increment value d. The phase-word x is fed to a Sin(x) lookup table (LUT) and is thereby converted into a corresponding sinusoidal amplitude-word value which is the output of the mapping device/LUT. The amplitude value is then fed into a DAC device that generates a corresponding analog signal level. In such devices the output frequency is actually determined by varying the increment value d. The larger the increment value d used, the higher the frequency of the resulting signal. The waveform of the resulting signal resembles a stair-case approximation of the desirable smooth sinusoidal waveform. Deviation from the smooth waveform give rise to unwanted frequency components in the output signal who's magnitudes correspond to the size of the deviations in amplitude and time of the output signal of the DAC. A large number of sample points per waveform period and a high precision of amplitude values are necessary in order to achieve low levels of unwanted frequency components in the resulting output signal.

Naturally, phase accumulator based devices generate output signals with continuous phase/waveform and are therefore inherently non-coherent. This is because the phase of the output signal is determined by the phase word value x of the phase accumulator independently of the selected frequency.

Several techniques for overcoming the non-coherent behavior of the phase accumulator based DDS circuits were previously suggested and implemented in operational circuits. Such techniques are disclosed for example in US patent publication No. 2008/0005213, U.S. Pat. No. 5,063,354 (A) and in U.S. Pat. No. 6,066,967.

As noted above, DDS systems which are based on the phase accumulator architecture inherently provide synthesis of signals with continuous phase which are not phase coherent. According to some techniques, coherent signals are obtained by resetting the phase accumulator at a pre-determined time cycles (predetermined rate).

Other known techniques suggest calculating the required phase value at every frequency switching operation and modifying the phase accumulator value to comply with the calculated phase value.

Multiplying Digital Synthesizer (MDS) is another signal synthesis technique known in the art allowing generation of phase-coherent signals. This technique does not utilize a phase-accumulator but instead it utilizes a phase/time-counter with fixed incremental value. According to this technique, multiple Sine LUTs are stored in a memory module. The Sine LUTs present sampled Sine amplitudes sampled at different rates which correspond to different output frequencies. Different numbers of amplitude words (which are multi-bit values) are stored at each LUT. Accordingly, switching between different output frequencies is performed selecting different LUTs. This technique is described for example in patent publication No. U.S. Pat. No. 6,597,208 and in US patent application 20110199127.

GENERAL DESCRIPTION OF THE INVENTION

Direct digital synthesizers DDS are widely used by electronic circuits today. Desired traits of DDS systems include: (i) generation of high frequency signals ranging over wide frequency band; (ii) fast/agile switching between various frequencies and (iii) coherent signal synthesis.

Phase-coherent signal synthesis is useful in various applications such as Radar, Global Positioning System (GPS) and similar applications where information is encoded onto the phase of a signal. Generating phase-coherent signals utilizing known in the art DDS techniques, typically impairs either the agility/speed of the frequency switching, the frequency bandwidths of the DDS and/or require phase generation circuits for each signal frequency.

The term Phase-Coherent signal (also referred to herein as coherent signal) designates a signal whose phase value, at a certain position and time, can be devised by knowing only the certain time and position and the phase of the signal at another position and time. This is, regardless of whether the signal was revoked and/or invoked in between the certain and another times and positions. More specifically for a synthesizer to be phase coherent, the phase of its signal frequencies must be continuous as if the signal frequencies are produced by truly independent and continuous sources. In other words whenever a specific signal frequency is revoked and later on invoked its phase should be the same as it would be if it was never revoked. A frequency switching coherent signal source (coherent DDS) maintains the coherency for each one of its output signal frequencies irrespective of the number and timing of the frequency switches.

The present invention provides a direct digital synthesis method and system which enables the direct generation of high frequency sine wave signals and coherent signal synthesis with agile/fast switching between a set of frequencies that spans a wide frequency band (e.g. several GHz wide). This is achieved, as will be described below, by utilizing frequency-patterns formed as bit-sequences or bit-patterns representing the signal frequencies to be synthesized by the system.

To this end, the terms frequency-pattern, bit-pattern and/or bit-sequence are used interchangeably herein to denote an ordered group of bits which are indicative of a certain rectangular waveform associated with a certain characteristic frequency. Each bit in the group of bits of a bit-pattern is associated with a certain respective position along the waveform and is solely indicative of the value/amplitude of the waveform at its respective position in the waveform and during the certain period. The bits may be arranged in any order while maintaining association between each bit and its respective position (time) along the waveform. For example, bits may be ordered sequentially according to their position along the waveform.

It should be noted that the term characteristic frequency (CF) of a bit pattern denotes a certain prominent frequency component of a signal obtained by cyclically serializing a bit-pattern utilizing appropriate sampling clock frequency. In this regard it should be understood that the term bit indicates a digital binary value which may be stored by a single bit, e.g. in physical memory. The term bit-flip corresponds to the logical operation NOT applied to the binary value of a bit (changing logical '1' to '0' and vice-versa). Also the terms word or word-value and multi-bit are used herein to indicate numerical values which require multiple bits for their representation.

The present invention utilizes multiple bit-patterns which are provided by a wave-pattern module that is capable of storing and/or generating those bit patterns on demand. Each bit patterns is utilized for the serialization of the rectangular waveform signal with its corresponding characteristic frequency. The rectangular waveform signal is then filtered with a respective filter in order to suppress spurious which are different from its characteristic frequency to thereby obtain a substantially sinusoidal signal with the characteristic frequency. Optionally, the characteristic frequency of the sinusoidal signal is further converted (e.g. up-converted) to obtain the final output signal frequency.

Certain advantages of the present invention result from the fact that the waveform amplitudes are represented by single bits of the bit-patterns. This provides efficient and economical memory utilization in cases where the bit-patterns are stored in the DDS memory. In cases where bit-patterns are generated on the fly, it allows high speed and computationally efficient bit-pattern generation. In both cases, highly agile frequency switching is achieved because each waveform sample is defined by a single bit and because a minimum of 2 samples per characteristic frequency cycle are sufficient (Nyquist sampling).

Another inherent advantage of the utilization of bit-patterns results from the fact that, in such systems, use of a digital-to-analogue converter (DAC) may be obviated. This is because serialization of single bit-values, a bit- at a time, directly provides a rectangular analogue signals with binary voltage values. This is different from the conventional techniques in which a DAC is required for converting the multi-bit signal data into an analogue signal with a non-binary, instantaneous, signal voltage. Obviating use of a DAC is advantageous for several reasons and inter-alia because it allows generation of signals with frequencies higher than the order of conventional DAC conversion time. For example, the generation of signals with frequencies higher than twice the DAC's conversion time. Also Obviating use of a DAC avoids the high power consumption associated with utilization of a fast high resolution DAC and its associated throughput data interfaces.

It should be understood that in the context of the present invention, the term DAC refers to multi-bit DAC's which are operable for converting a multi-bit value into an analogue signal voltage. A single-bit "DAC" which can be implemented as switch unit or utilizing voltage convertor/buffer/driver is not considered or referred to herein as DAC.

It is also appreciated that waveforms represented by bit-patterns can be serialized substantially faster than digital to analogue conversions required to produce waveforms in which amplitude at each instantaneous point (position/time) is represented by multi-bit values or word values. Therefore utilizing bit-patterns to serialize rectangular waveform signals, which instantaneous voltages/currents are indicated by single binary values, accommodates synthesis of high frequencies limited by the maximum clock rate of the serializer circuit that is used. Current serializer logic technology can reach well into mm-wave frequencies.

As a result of the above described advantages, a DDS system according to the present invention can be configured such that coherent signal frequency switches can take place as fast as the slowest of two durations: one logic clock period or filter setup time, both measured from obtaining a frequency switch command at the DDS. As explained in the detailed description below, and understanding the frequency switches performed in accordance with the invention may sometimes be performed as fast as one logic clock period, it should be appreciated that according to the invention frequency switches may be performed within a single digit count of logic clock periods. Such system can be configured for direct production of signals with frequencies up to one half its sampling clock frequency. Therefore, it can be used for direct generation of signals with frequencies residing in the microwaves and mm-wave regimes.

Coherent signal synthesis is achieved, according to the present invention, by utilizing bit-patterns of the same length (i.e. having the same number of bits) for representing rectangular waveforms of different characteristic frequencies. A serializer is operating to serialize a selected bit pattern by consecutively determining an instantaneous cyclic phase value corresponding to the position of the next bit to be serialized (i.e. coherent position e.g. bit index). Because the bit-patterns are of the same length this position is determined independently from the currently selected bit-pattern and based only on the instantaneous cyclic phase value. This provides that invoking the serialization of a previously revoked bit-pattern commences at the invoked time from the same bit-position as it would have been had it not being revoked in the first place. Thus the present invention inherently provides synthesis of coherent signals.

In this regards, the length of the bit-patterns (number-of-bits) is determined such that each of the desired characteristic frequencies can be represented as an initial bit-pattern formed by an integer number of periods comprised of one or more bits with logic '1' value and followed by a number of bits with logic '0' value. As will be clarified further below, in practice a modified version of this set of initial bit patterns (termed here below optimized bit patterns) is typically used to by the DDS system of the present invention.

When bit-patterns are used for representing and synthesizing rectangular waveform signals with respective characteristic frequencies, the resulting rectangular waveform signal contains additionally other component frequencies which are different from its characteristic frequency. Those other frequencies are referred to as spurious frequencies. Indeed, in some cases it is possible to filter the spurious frequencies to obtain sinusoidal signal with the characteristic frequency. However, due to practical and physical limitations of existing frequency filters/filtration-modules, not all spurious frequencies can be practically filtered and suppressed.

More specifically, standard filters cannot be produced with any desired filtration profile/shape. It is also impractical to provide each characteristic frequency with its unique band-pass filter due to signal routing complexity and size. For example, band-pass filters are limited in the width of their pass-band and can't be made to provide desirably narrow pass-band. Accordingly, when utilizing practical band-pass filter to filter a rectangular waveform having a certain characteristic frequency, the filtration process might not remove/suppress spurious frequencies which reside within the pass-band of the filter.

This problem is solved by the present invention, by providing a system and method allowing generation of optimized bit-patterns for which spurious frequencies can be suppressed to below a certain acceptable level. Each such optimized bit-represents a rectangular waveform characterized with a desired characteristic frequency and with spurious frequencies which are sufficiently distant from the characteristic frequency (e.g. to accommodate the pass-band of a practical filter). This allows utilizing a practical band-pass filter to suppress all of the signal's spurious frequencies while passing its characteristic frequency. According to the present invention appropriate selection of optimized bit-patterns allows multiple bit-patterns to use a common filter. The quality/purity of a sinusoidal signal obtained in this manner (by filtering a rectangular waveform signal) can be expressed in terms of the spurious free range of the signal (SFR).

In the present disclosure, the term spurious free range SFR indicates the ratio between the power of a characteristic frequency component of a signal and the power of the highest (most powerful) frequency component of that signal which has frequency other than the characteristic frequency (namely the strongest spurious frequency component). The powers of the frequency components are conventionally expressed in dB. A minimum acceptable SFR value (referred to herein as threshold or SFR threshold), depends on requirements of a particular application of a DDS and may be for example 60 dB and in some cases higher. In this regards the term spurious free frequency band (SFFB) indicates the spurious free band (e.g. range) surrounding the characteristic frequency and in which the powers/amplitudes of frequency components, other than the characteristic frequency, are sufficiently low with respect to the power of the characteristic frequency component as specified by the desired SFR threshold. SFFB is used here to indicate a property of a bit-pattern and of the signal serialized therefrom. In other words, the term SFFB indicates a frequency band in which the serialized signal does not contain spurious frequency components with levels which are above a certain SFR. SFFB is significant because an appropriate filtration of a signal to a desired purity (above the threshold SFR) requires utilizing a filter whose pass-band is equal or narrower than the SFFB. Namely, the pass-band should be overlaid/covered by the SFFB and accommodated therewithin.

The invention utilizes the fact that a rectangular waveform having prominent frequency component at certain characteristic frequency (CF) can be represented by several different bit-patterns variations having the same size/length M. Waveforms represented by those different bit-patterns may have substantially similar powers of their CF component but with different powers of other frequency components and accordingly different SFFB's. Generating a sinusoidal signal with the CF is achieved, according to embodiments of the invention, by processing/determining and utilizing a "filterable" bit pattern variation of these different bit-patterns which has sufficiently wide SFFB accommodating the pass-band of a practical frequency filter. A set of such filterable bit-patterns can be obtained, for example, by utilizing optimization methods as described below.

Thus, according to a broad aspect of the present invention there is provided a method for digital synthesis of electric signals, the method comprising:
a. providing one or more bit-patterns each indicative of a rectangular waveform having a characteristic frequency.
b. determining a selected signal frequency to be synthesized and obtaining a selected bit-pattern associated therewith.
c. cyclically serializing bits of the selected bit-pattern to generate a substantially rectangular waveform signal comprising said characteristic frequency; and
d. filtering the signal to suppress spurious frequencies outside a certain unfiltered frequency band which corresponds to the selected bit-pattern.

The method thereby allows obtaining a filtered signal with prominent frequency component corresponding to the selected signal frequency.

According to some embodiments of the present invention, the amplitude of the generated rectangular waveform is indicated, at any cyclic phase, by a binary value of a single bit in the selected bit pattern. This optionally allows for obviating use of a DAC in the synthesis of the signal.

Also in accordance with some embodiments of the present invention, a Fourier spectrum of the rectangular waveform is characterized in that the ratio between the spectral power of said characteristic frequency and the spectral powers of other frequencies within the unfiltered frequency band is higher than a certain spurious free range (SFR) to be obtained in the filtered signal. The filtered signal may be for example substantially sinusoidal.

According to some embodiments of the invention, the one or more bit patterns have identical bit-length (M). Cyclic serialization of bits from a selected bit-pattern is performed by repeatedly determining a cyclic phase value and serializing a corresponding bit of the selected bit pattern. The cyclic phase may be determined independently from the selected signal frequency and its associated bit pattern (e.g. cyclic phase may be determine utilizing a sampling clock). This thereby enables to revoke synthesis of a certain signal of a certain selected frequency and later on invoke synthesis of the certain signal while maintaining coherency of the said certain signal. Synthesis of other signals may be carried out during intermediate times between revoking and invoking synthesis of that certain signal.

According to some embodiments of the invention, the cyclic phase may be determined utilizing a sampling clock. The one or more bit patterns may have identical bit-length (M) that equals to an integer multiple of the frequency of the sampling clock divided by a largest common factor of a set of the characteristic frequencies corresponding to the bit-patterns.

Typically, the at least one of the bit-pattern is indicative of a rectangular waveform having characteristic frequency. Such bit-pattern may be in the form of a modified series of M single-bit samples, sampled at fixed-intervals from a repeating waveform containing said characteristic frequency. The series of M single-bit samples is modified to suppress spurious frequencies within a certain unfiltered frequency band surrounding the characteristic frequency if the bit pattern. In some cases the bit-pattern is modified such that the difference between the power of the characteristic frequency and the powers of spurious frequencies of the bit pattern is above a certain SFR threshold. Also modification of the bit-patterns may optionally be optimized according to the invention to reduce a number of unfiltered frequency bands corresponding to the bit-patterns. Such optimization allows reducing a number of required filters needed for filtering signals generated utilizing the bit-patterns.

According to some embodiments of the invention the characteristic frequency of a bit-pattern is substantially equal to the selected signal frequency. Alternatively or additionally the method may include applying frequency up-conversion to a filtered signal having the characteristic frequency in order to obtain a signal with the selected signal frequency.

In some embodiments the signal obtained from selected bit-pattern is filtered utilizing a band pass filter selected according to the frequency associated with said bit-pattern. The signal may be filtered, for example, utilizing a filter bank (e.g. where the band pass filter is selected from the filter bank).

According to another broad aspect of the present invention there is provided a system for digital synthesis of electric signals, the system comprising:
a. wave-pattern module configured and operable for providing one or more bit-patterns each indicative of a rectangular waveform having characteristic frequency.
b. frequency selector for determining a selected signal frequency to be synthesized and selected bit-pattern associated therewith.
c. serializer module, connectable to the frequency selector for determining the selected bit-pattern, and configured and operable for obtaining, from the wave-pattern module, data bits of the selected bit pattern and serializing the data-bits to generate substantially rectangular waveform signal with the characteristic frequency in an output channel. and
d. filtration module operable for filtering said signal to suppress spurious frequencies outside a certain unfiltered frequency band corresponding to said selected bit-pattern to thereby form, in output channel, a filtered signal (e.g. substantially sinusoidal signal) having prominent frequency component corresponding to the selected signal frequency.

According to some embodiments of system of the invention, at least one bit-pattern is configured such that, at any cyclic phase, the amplitude of the rectangular waveform associated with the bit-pattern is indicated by a binary value of a single data-bit of the bit-pattern. This possibly enables to obviate use of a multi-bit DAC for the synthesis of the rectangular waveform signal.

The system, according to some embodiments of the invention, utilizes at least one bit pattern that is indicative of a rectangular waveform. The ratio between the spectral power of the characteristic frequency of the rectangular waveform and spectral powers of other frequencies thereof, which are within an unfiltered frequency band surrounding its characteristic frequency, is higher than a certain SFR to be obtained in the filtered signal.

According to some embodiments, the serializer module is configured and operable for repeatedly determining a cyclic phase value and serializing a corresponding bit of the selected bit pattern. The cyclic phase may be determined independently form the selected signal frequency and bit pattern thereby enabling to revoke synthesis of a certain signal having certain selected frequency and later on invoke synthesis of the certain signal while maintaining coherency of that certain signal. The system may also be configured and operable to enable synthesis of other signals during intermediate times between revoking and invoking synthesis of that certain signal.

According to some embodiments of the invention, the serializer module is associated with a sampling clock utilized to determine a cyclic phase value of a waveform to be serialized. The one or more bit patterns may have identical bit-length (M). The bit-length (M) optionally equals to an integer multiple of the frequency of the sampling clock divided by a largest common factor of the frequencies characterizing the bit-patterns.

As noted above, according to some embodiments of the invention, at least one of the bit-patterns is indicative of a rectangular waveform having characteristic frequency. Such a bit pattern may be in the form of a modified series of M single-bit samples, sampled at fixed-intervals from a repeating waveform containing that characteristic frequency. The series of bits is optionally modified to suppress spurious frequencies within a certain unfiltered frequency band surrounding said characteristic frequency. According to some embodiments of the invention a rectangular waveform signal, generated by the serializer module, has characteristic frequency that is substantially equal to the selected signal frequency. Alternatively or additionally, the prominent frequency of the filtered signal is different from the selected signal frequency and the system further includes a frequency up-conversion module, which is connected to the output channel and operable for generating the selected signal frequency by up-converting the frequency of the signal obtained from the filtration module.

According to some embodiments of the invention, the filtration module includes one or more band-pass filters associated with the bit-patterns. For example the signals may be filtered utilizing a filter bank.

According to some embodiments of the invention the wave-pattern module includes at least one of a memory module storing the one or more bit-patterns in association with their corresponding characteristic frequencies; and a bit-pattern generator module for generating bit-patterns corresponding to different characteristic frequencies.

According to yet another broad aspect of the present invention there is provided a method for designing a frequency pattern including a sequence of bits. The frequency pattern represents sequential samples in time of a repeating waveform whose discrete Fourier transform defines a frequency spectrum. The frequency pattern waveform is filtered by a filter to produce a sine-wave signal having a characteristic frequency. The method includes:
a. determining the number of bits included in the sequence of bits.
b. computing an initial frequency pattern including computing initial values for bits included in the sequence of bits.
c. evaluating the effect of bit flips in the initial frequency pattern, thereby creating a modified frequency pattern, applying discrete Fourier transform to the waveform represented by the modified frequency pattern and determining the amplitudes of frequencies in a resulting frequency spectrum; and
d. selecting a frequency pattern that corresponds to a frequency spectrum having substantially high amplitude of the characteristic frequency while signal frequencies near the characteristic frequency have acceptably low amplitude levels.

According to further aspect of the present invention there is provided a method for designing a set of frequency patterns. Each pattern in the set includes a sequence of bits with a number of bits that is equal to the number of bits of all other frequency patterns in the set. Each frequency pattern represents sequential samples in time of a repeating waveform whose discrete Fourier transform defines a frequency spectrum. The frequency spectrum is filtered with a filter that is selected from a set of filters and produces a characteristic sine-wave signal frequency. The method includes:

a. determining the number of bits included in each one of the set of frequency patterns.
b. computing initial values for the bits included in each one of the set of frequency patterns; and
c. evaluating the effect of bit changes in the initial frequency pattern of each one of the set of frequency patterns and selecting a set of frequency patterns that minimize the number of filters in the set of filters that are necessary to filter the set of characteristic frequencies.

The invented approach thus provides direct digital synthesis technique allowing synthesizing coherent signals with possibly high frequencies of the signals. The technique utilizes specifically designed bit sequences for digital synthesis of rectangular waveforms, each containing prominent frequency component corresponding to a desired output frequency. The rectangular waveform is filtered to suppress frequencies other than the prominent frequency and possibly also up converted to obtain a signal with the desired output frequency.

According to yet another aspect of the invention, there is provided a method for digital synthesis of electric signals, comprising:
synthesizing a certain signal of a certain selected frequency;
obtaining a first frequency switch command;
switching to another signal of another selected frequency by revoking synthesis of the certain signal and synthesizing the other signal;
obtaining a second frequency switch command; and
switching to the certain signal by revoking synthesis of the other signal and invoking synthesis of the certain signal while maintaining coherency of the said certain signal;
wherein switching to another signal and switching to the certain signal, measured from obtaining the first frequency switch command and the second switch command respectively, are performed within a single digit count of logic clock periods.

DESCRIPTION OF THE DRAWINGS

In order to understand the invention and to see how it may be carried out in practice, embodiments will now be described, by way of non-limiting example only, with reference to the accompanying drawings, in which:

FIGS. 4A and 4B graphically illustrate the spectral content of a set of bit-patterns before and after they are optimized to reduce the number of required filters;

DETAILED DESCRIPTION OF EMBODIMENTS

Figure 1A:
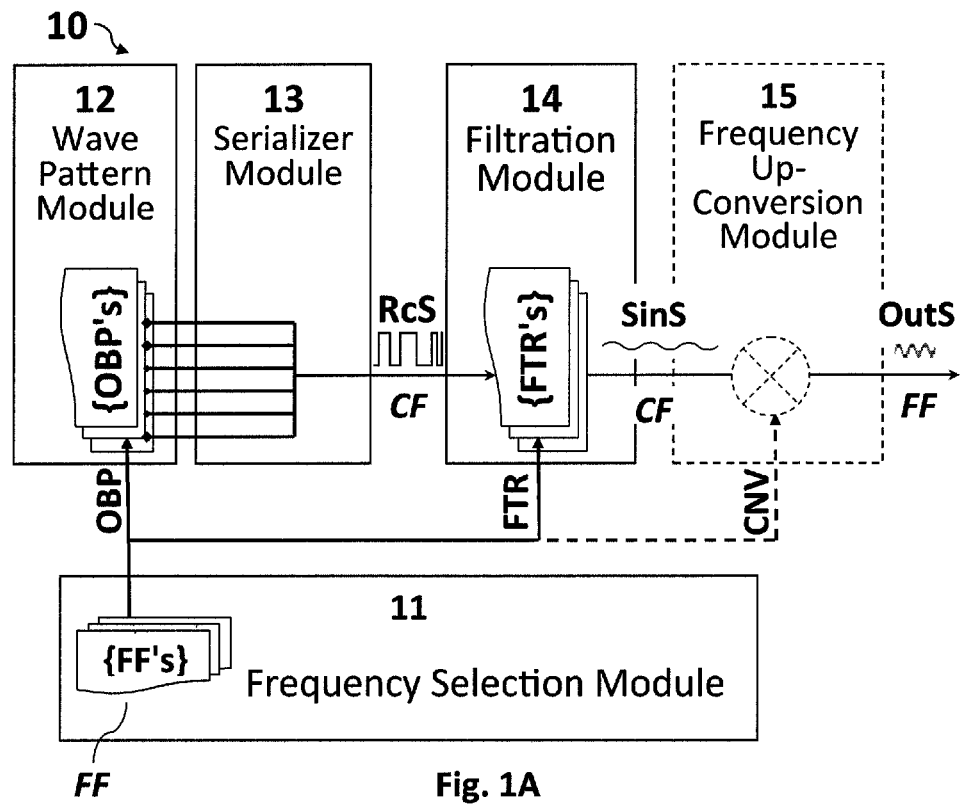
FIG. 1A illustrates schematically a coherent DDS system according to some embodiments of the present invention.

This application claims priority from U.S. Provisional Patent Application Ser. No. 61/429,281 filed on Jan. 3, 2011, the disclosure of which is incorporated herein by reference for all purposes.

According to the present invention a method and system for Direct Digital Synthesis (DDS) are provided allowing frequency selection and digital generation of sine wave signals. The principles and operation of the present invention may be better understood with reference to the drawings and accompanying description.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. As used herein, the phrase "for example," "such as" and variants thereof describing implementations of the present invention which are provided herein only as examples and as such they are not limiting.

Also, it is to be understood that the phraseology and terminology employed herein is for the purpose of description and should not be regarded as limiting. Unless defined otherwise, all technical and scientific terms used herein have the same meaning as commonly understood by one of ordinary skill in the art to which this invention belongs. In the following description components that are common to more than one figure will be referenced by the same reference numerals.

In addition, unless specifically noted, embodiments described or referenced in the present description can be additional and/or alternative to any other embodiment described or referenced therein.

Turning to the drawings and referring first to FIG. 1A there is illustrated schematically, in the form of a block diagram, a coherent direct digital synthesis (DDS) system 10 in accordance with certain embodiments of the present invention. The system 10 exemplified herein as well as other DDS embodiments presented below, allow phase coherent direct digital synthesis of output signals with various output frequencies.

System 10 includes a wave-pattern module 12 configured and operable for providing one or more bit-patterns OBPs, a serializer module 13 connected to the wave-pattern module 12 and operable for generating a rectangular waveform signal RcS by cyclically serializing bits of a selected bit-pattern OBP (selected from the bit-patterns OBPs of the wave-pattern module 12) and, a filtration module 14 configured and operable for utilizing suitable filter FTR to filter the rectangular waveform signal RcS and to generate thereby substantially sinusoidal signal SinS with a prominent characteristic frequency CF corresponding to the selected bit-pattern OBP.

System 10 also includes a frequency selector module 11 that is configured and operable for obtaining/receiving/determining data (e.g. instructions) indicative of a selected frequency FF to be synthesized. According to the selected frequency FF, frequency selector module 11 selects the appropriate bit-pattern OBP to be serialized, and a suitable filter FTR to be used for filtering the serialized rectangular waveform signal RcS.

The wave pattern module 12 can be implemented in any manner that allows provision of bit-patterns OBPs allowing generation of a desired set of characteristic frequencies CFs with satisfactory SFR meeting or exceeding a certain desired minimum SFR threshold. For example, wave pattern module 12 may include a memory unit (not shown; e.g. RAM, ROM, FLASH etc.) storing a set of optimized bit-patterns OBPs. The optimized bit-patterns OBPs may be pre-prepared in accordance with the set of characteristic frequencies CFs that should be synthesized. It can be appreciated that selecting the appropriate OBP may be performed within a single logic clock period, and hence, it can be performed within a single digit count of logic clock periods. Therefore, frequency switching can be performed within a single digit count of logic clock periods.

Alternatively or additionally the wave pattern module 12 may be configured and operable for generating optimized-bit OBPs patterns on the fly in accordance with the frequency that should be synthesized. In such cases, wave pattern module may include a processing module (not shown) capable of generating optimized bit-patterns OBPs corresponding to desired characteristic frequencies CFs and to a sampling clock rate.

Filtration module 14 allows filtration of various rectangular waveform signals RcS having characteristic frequencies CFs. To this end, filtration module 14 is generally configured and operable to provide various filtration-profiles FTRs (also termed here as filter-shapes or just filters). Actually, each synthesized rectangular waveform signal RcS with characteristic frequency CF is associated with a certain filtration profile FTR allowing to filter the rectangular signal RcS and to provide sinusoidal signal SinS with the characteristic frequency CF. To achieve that purpose, filtration module 14 may be implemented with any suitable frequency filtration technique employing fixed or tunable filters, for example utilizing a switched-filter-bank and/or utilizing any number of physical frequency filter circuits/units having suitable filtration profiles (e.g. band-pass filters, band-stop filters etc').

Frequency selector module 11 may serve as the interface of system 10, allowing selection of the synthesized signal frequency FF. Module 11 associates each output signal OutS frequency FF with a corresponding optimized bit-pattern OBP to be provided by wave-pattern module 12 and with corresponding filtration-profile (frequency filter) FTR to be applied by filtration module 14. Frequency selector module 11 is connectable to the wave pattern 12 and filtration 14 modules and operable to switch the selected optimized bit-pattern OBP and the selected filter FTR in accordance with the desired signal frequency FF to be synthesized.

Serializer module 13 performs cyclic serialization of bits from a selected optimized bit-pattern by repeatedly determining a cyclic phase value and a corresponding position P of the next bit to be serialized.

It should be noted that according to the invention, optimized bit-patterns OBPs which are used to generate and transit between coherent signals of different frequencies, are designed with the same bit length M. Therefore, the position P is independent from the selected bit-pattern OBP (i.e. it designates a position along all the optimized bit-pattern of the same length). Since the position P is independent of the selected bit-pattern OBP, it is then possible to transiting between different bit-patterns OBP's while maintaining coherency of signals generated thereby.

This feature enables to revoke synthesis of a certain signal of a certain selected frequency FF (utilizing a certain optimized bit-patterns OBP) and later on invoke synthesis of that certain signal while maintaining coherency of that certain signal. Indeed, other signals of other frequencies may also be synthesized during intermediate times between revoking and invoking synthesis of the certain signal.

Figure 1B:
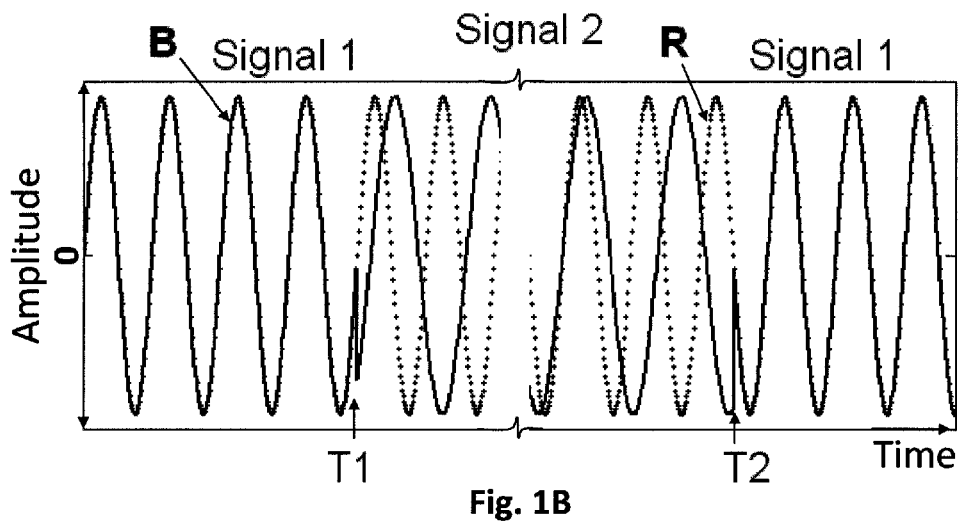
FIG. 1B is a graphical illustration of coherent signal synthesis.

Referring to FIG. 1B there is exemplified a graph B of the waveform of a phase coherent signal which may be generated by system 10 of the present invention. The graph B indicates the voltage (or current) amplitude of the signal waveform with respect to time. Signal1 (of a certain corresponding optimized bit pattern) is generated before the time marked T1 and the sinusoidal wave reflects the frequency and phase of that signal. At T1 the frequency selector module (11 in FIG. 1A) is switched to generate Signal2 (corresponding to another optimized bit-pattern). At that time the continuation of the waveform of Signal1 is shown in a graph R. After an arbitrary period of time, at a time marked T2 the frequency selector module is switched back to generate Signal1 again. At T2 the waveform of Signal1 continues coherently, from the same phase point at which it would have been (shown in the graph R) at time T2, as if there was no switch from Signal1 to Signal2.

It should be noted that in the illustration the waveform graph B is not smooth or continuous at T1 and T2. In reality and most practical applications this discontinuity is smoothed out by physical limitations of the signal source. This is because actual signal sources have a limited bandwidth and are thus unable to produce truly instantaneous voltage steps.

Turning back to FIG. 1A, as a result of the appropriate selection of optimized bit-pattern OBP and filter FTR, signals RcS and SinS which are generated by serializing the selected bit pattern OBP, have prominent characteristic frequency CF corresponding to the selected frequency FF. According to some embodiments of the invention, the characteristic frequency CF equals the selected frequency FF and thus the sine signal SinS serves as the system's output signal OutS with selected frequency FF.

Optionally however, according to some other embodiments of the invention, the characteristic frequencies associated with one or more bit-patterns need to be converted in order to obtain output signals with the desired final output frequencies. Specifically for example, up-conversion or multiplication may be required to convert the frequency CF of the SinS signal to the desired frequency FF of the output signal OutS.

In such embodiments, system 10 may further include frequency-conversion module 15 (e.g. up-convertor). Frequency-conversion module 15 may be connected to the filtration module 14. Frequency-conversion module 15 is adapted for converting (e.g. up-converting) the characteristic frequencies (CFs) of at least some of the sinusoidal signals SinS, outputted from the filtration module 14, and to generate corresponding output sinusoidal signals OutS with the respective output frequencies (FFs).

Frequency-conversion module 15 may be implemented utilizing any suitable frequency conversion technique. For example, frequency-conversion module 15 may be implemented by mixing the SinS signal with a local oscillator signal to generate an output signal OutS with converted frequency contents. Frequency-conversion module 15 is associated with a conversion parameter/factor CNV.

According to some embodiments frequency-conversion module 15 is implemented with a fixed frequency conversion/ up-conversion parameter CNV. Alternatively, according to some embodiments, frequency-conversion module 15 is implemented with a tunable/variable conversion parameter CNV. Frequency-conversion module 15 with such tunable conversion parameter CNV can be implemented for example by switching between multiple local oscillator signals having different frequencies.

The value of the tunable conversion parameter CNV may be selected in accordance with the selected bit-pattern OBP in order to obtain the desired frequency FF. Accordingly in such embodiments, frequency-conversion module 15 is connected to the frequency selector module 11 which is in-turn, operable for selecting the frequency conversion parameter CNV in accordance with the selected frequency to be synthesized FF.

As noted above, several advantages of the present invention result from the fact that according to the invention, waveforms are represented by patterns of bits (i.e. bit-patterns OBP's). At each position/time along a waveform, its amplitude is indicated by a single bit. Accordingly, generating a rectangular signal RcS with certain characteristic frequency CF is achieved by selecting and serializing the appropriate bit-pattern OBP, a bit at a time. Because at any particular position along the rectangular waveform signal, the signal's amplitude is represented by a single binary value in the bit-pattern, a digital to analogue conversion (DAC) may not be required for generating the rectangular waveform RcS. The present invention, thus, provides a simplified direct digital synthesis method, which may obviate use of a DAC.

Figure 1C:
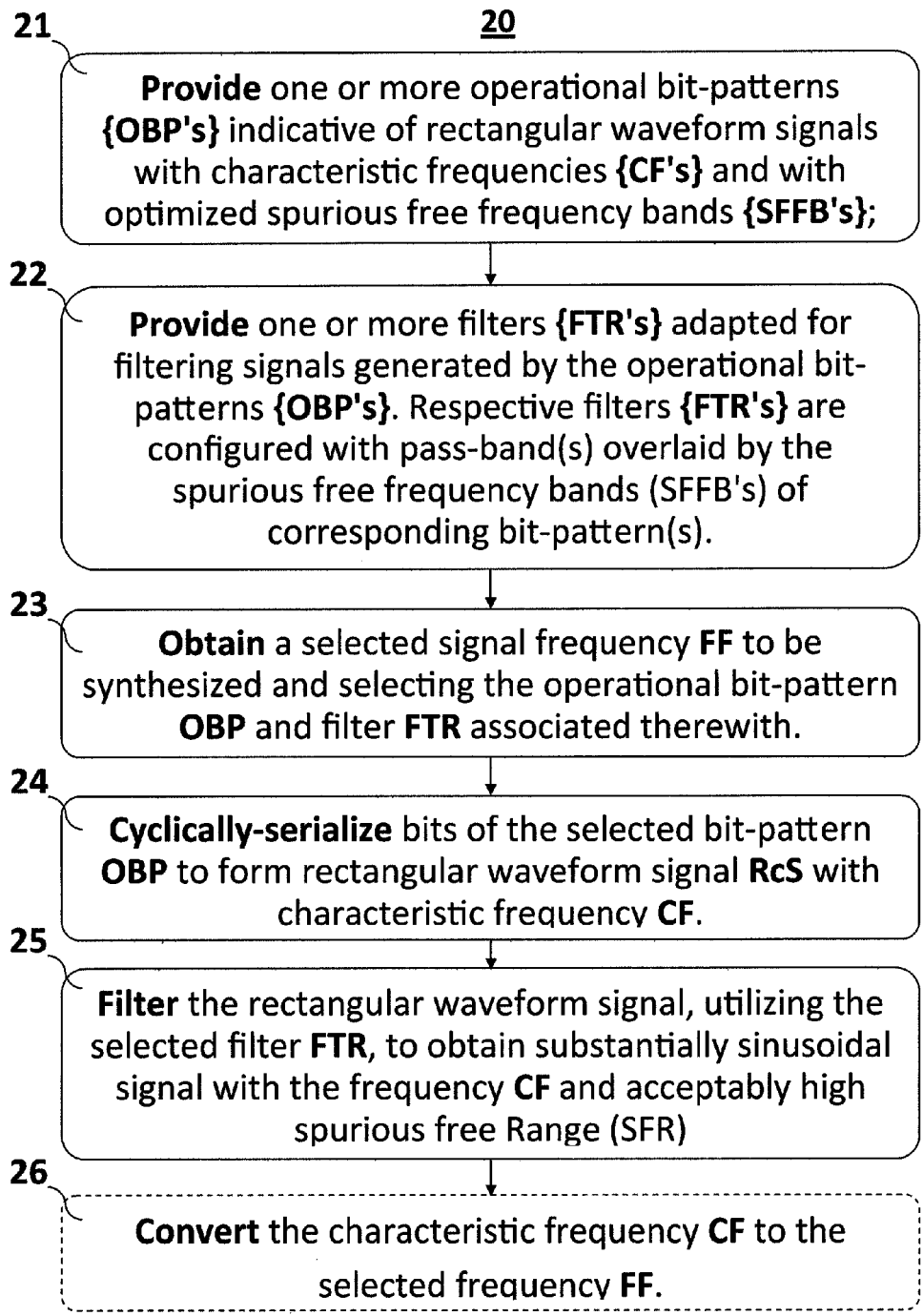
FIG. 1C is a flow chart illustrating a method for coherent signal synthesis according to some embodiments of the present invention.

The direct digital synthesis method 20 of the present invention is illustrated schematically in FIG. 1C. The method provides synthesis of coherent sinusoidal signals and is implemented by the embodiment of system 10 illustrated in FIG. 1A. In the following description of method 20, reference is occasionally made also to the elements of system 10 of FIG. 1A in which method 20 may be implemented.

In 21 one or more optimized bit-patterns OBPs are provided by wave-pattern module 12. Each optimized bit-pattern OBP is indicative of a rectangular waveform with corresponding characteristic frequency CF. Each optimized bit pattern OBP provided in 21 is configured such that when suitably serialized, it forms a rectangular waveform signal having acceptably high SFR within a certain spurious free frequency band (SFFB). SFFB of each bit pattern OBP is selected to include the characteristic frequency CF of the bit pattern OBP. Also, an SFFB of a bit pattern OBP is configured to accommodate (overlay/cover) the band-pass of a frequency filter FTR that is operated together with the bit pattern. Namely, to accommodate the band-pass of a frequency filter FTR that is used for filtering the rectangular signal RcS generated by the bit-pattern OBP.

As noted above, the optimized bit-patterns OBPs may be generated (e.g. on the fly) by the wave-pattern module 12, or pre-prepared (e.g. by another system) and stored by the wave-pattern module 12 or in a memory accessible thereto. An example of a method for generating a set of optimized bit patterns OBPs having acceptably high SFR is described further bellow in connection with FIG. 2A.

In 22 one or more frequency filters/filtration-profiles FTRs associated with the optimized bit-patterns OBPs are provided (e.g. by filtration module 14). Each filter FTR may be associated and used for filtering signals generated by multiple optimized bit patterns OBPs. In this respect all the OBPs, used with a common filter FTR, should have respective SFFBs each includes the band-pass of the filter FTR. Preferably, as is also described below, optimized bit-patterns OBPs are designed and generated to reduce the number of required filters FTRs.

A frequency FF of the signal to be synthesized is obtained in 23 (e.g. provided/selected by frequency selector module 11). Accordingly an optimized bit-pattern OBP, a corresponding filtration-profile/filter FTR and optionally also a suitable up-conversion parameter/factor CNV are selected to enable generation of an output signal with the selected signal frequency FF.

It should be noted that 21 and 22 described above are configuration steps which may be carried out once to provide the setup for the generation of output signals with frequencies of the set FFs. 21 and 22 may be performed concurrently or with any suitable order. In 23, a frequency FF is selected for synthesis and corresponding optimized bit-pattern OBP, frequency filter FTR and possibly also suitable conversion parameter CNV are obtained to allow synthesis of the frequency FF. The following 24 to 26 are operative steps which generate an output signal OutS with the selected frequency FF. The output signal OutS is generated by utilizing the bit-pattern OBP, filter FTR and conversion parameter CNV, which are selected in 23. Frequency selection, performed in 23, can be carried out multiple times during the operation of 24 to 26 in-order to switch between signals of various frequencies.

In 24, serializer module 13, performs cyclic and consecutive serialization of single bits values from the selected bit-pattern OBP, thereby forming a rectangular waveform signal RcS containing prominent frequency component having characteristic frequency CF corresponding to the selected bit-pattern. Serializer module 13 operates repeatedly to determine a cyclic phase value and to accordingly determine the next bit to be serialized from the selected bit-pattern OBP. The cyclic phase value is determined, as noted above, utilizing a sampling clock data/signal. Considering that each optimized bit pattern OBP in a set of optimized bit-patterns OBPs has the same bit-length M, a coherent signal synthesis is provided at the serializer's output.

Generation of a sinusoidal signal SinS with the characteristic frequency CF is performed in 25 by suppressing spurious frequencies of the rectangular waveform signal RcS which are different then the characteristic frequency CF to be desirably obtained in the sinusoidal signal. Suppressing is done by the aid of a suitably selected filtration profile/filter as was previously explained.

Optionally, in some cases additional frequency conversion is employed to convert the characteristic frequency CF of the SinS signal to the desired output frequency. In these cases, optional up-conversion 26 is applied to the output signal OutS.

As noted above, frequency switching speed and high frequency signal synthesis are major advantages of the technique of the present invention. These advantages are achieved by, bit by bit serialization of bit-patterns, forming analogue rectangular waveform signal RcS. Sinusoidal signal SinS with the characteristic frequency CF is then obtained by filtering/suppressing spurious frequencies from the rectangular waveform signal RcS. These spurious frequencies differentiate the rectangular waveform signal RcS from the desired sinusoidal signal SinS and thus by suppressing them the desired sinusoidal signal SinS may be obtained.

However, in some cases, not all spurious frequencies, can be filtered or suppressed by practical band-pass filters. Specifically, spurious frequencies of a rectangular waveform RcS residing within the pass-band of the filter are not suppressed. This is solved, according to one embodiment of the invention, by utilizing a set of optimized bit-patterns OBPs which can be adequately filtered by practical frequency filters. To this end the term practical frequency filters refers to non-ideal, realworld filters which typically have pass-bands of finite width (not infinitesimally narrow) in which the signal is substantially not attenuated (but typically not entirely un-attenuated) and outside which the signal is substantially attenuated (but typically not entirely attenuated).

Each such optimized bit-pattern OBP is designed to produce an RcS signal (with corresponding characteristic frequency CF) having sufficiently high SFR within the pass-band(s) of a respective filter FTR used with the bit-pattern OBP. This allows generation of e faithful sinusoidal signals with sufficiently high-SFR.

Figure 2A:
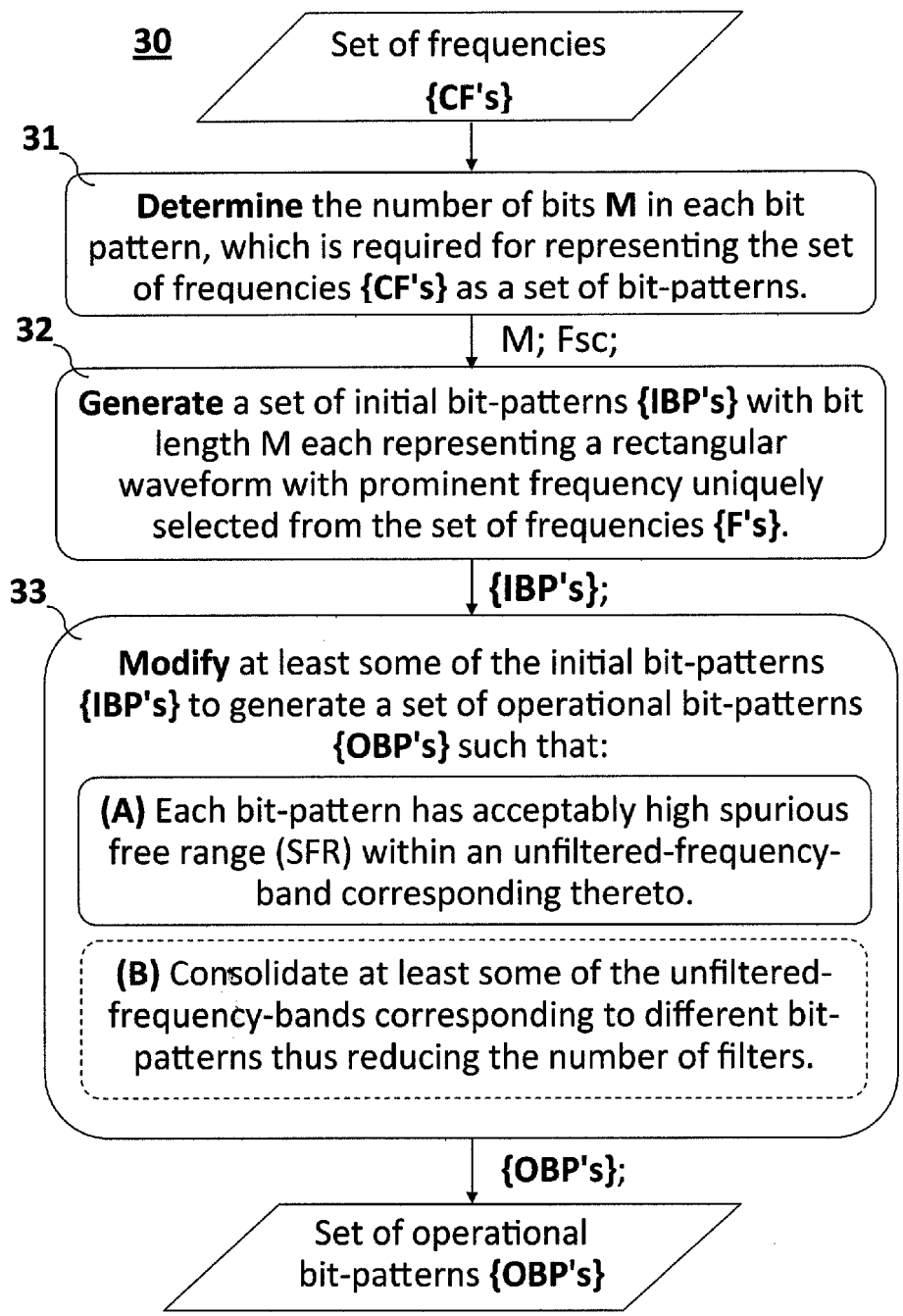
FIGS. 2A and 2B illustrate a method and a system for generating optimized bit-patterns.

Reference is now made to FIG. 2A in which an embodiment 30 of a method for the generation of optimized bit-patterns, illustrated in the form of a flow chart. In 31, the set of characteristic frequencies CFs is obtained and used to determine the length M of the bit patterns OBPs. M being the number of bits M in the bit-patterns. The length M is determined in a manner to insure that each characteristic frequency CF (in the set CFs) can be represented, by a bit-pattern with length M, as a periodic waveform with integer number of periods. A bit-pattern is formed as integer number of periods each comprised of one or more bits with a first logic value (e.g. '1') followed by a number of bits with a second logic value (e.g. '0').

Determining the number of bits M of the bit-patterns may be performed by determining a frequency step value FSTEP as the largest common factor of the characteristic frequencies CFs. Then, based on the Nyquist's sampling theorem, the minimal sampling frequency MSF allowing reconstruction of signals with characteristic frequencies CFs and without aliasing is provided as MSF=2*Max(CFs). Namely, the minimal sampling frequency MSF is determined as twice the highest of the characteristic frequencies.

The minimal number of bits $M_{min}$ each bit pattern is calculated as the minimal sampling frequency MSF divided by the frequency step: $M_{min}$=MSF/FSTEP. The actual length (number of bits) M of the bit-patterns is then selected as any non-zero integer (N) multiple of the minimal number of bits $M_{min}$. Namely: M=N*$M_{min}$. Many times N is set to be equal to 1. Determining the bit pattern length M as described above, the sampling clock frequency $F_{SC}$, which should be used for serializing bit-patterns OBPs to synthesize their respective characteristic frequencies CFs, is computed as $F_{SC}$=M*FSTEP.

Alternatively, in 31, the number of bits M in the bit patterns may be determined based on a given sampling clock frequency $F_{SC}$. In this case the minimal number of bits $M_{min}$ is given by the sampling clock frequency $F_{SC}$ divided by the frequency step FSTEP: $M_{min}$=$F_{SC}$/FSTEP. Also here, the number of bits M can be selected as any integer multiple N of the minimal number of bits $M_{min}$.

Having determined the number of bits M, a set of initial bit-patterns IBPs is generated in 32. For each characteristic frequency CF, in the desired set of characteristic frequencies CFs, an initial frequency pattern IBP is generated in the form of a vector of M binary values. Each initial bit-pattern IBP represents a rectangular waveform with prominent characteristic frequency CF that equals to one of the characteristic frequencies CFs in the set.

An initial bit-pattern for a certain characteristic frequency CF can be computed in a number of methods. For example, the value $IBP_{CF}(i)$ of each bit indexed i of an initial bit-pattern IBP with characteristic frequency CF can be calculated as follows:

$$IBP_{CF}(i) = \text{Ceil}\left(\text{Sin}\left(\text{Mod}\left(\frac{4*CF*\text{Mod}(i,M)}{M*FSTEP}, 2.001\right)*\pi\right)*0.9\right)$$

Where $IBP_{CF}$ is the initial-bit pattern computed utilizing the parameters CF. M, i and FSTEP are as defined above. Mod( ) is the modulus function, Sin( ) is the sine function for radians, and Ceil( ) is the rounding-up function.

Alternatively, for example, initial bit-patterns for the set of characteristic frequencies CFs can be computed in the following manner:

(i) A discrete spectrum vector S is defined for each characteristic frequency CF. This is achieved by defining an integer index CK that equals the characteristic frequency CF divided by the frequency step FSTEP defined above. The corresponding discrete frequency spectrum vector S is then computed as $$S_i = \begin{cases} 0 & \text{for } i \neq CK \\ A & \text{for } i = CK \end{cases}$$

where the index i ranges from 0 to M–1 and A is a non-zero amplitude value while according to some non-mandatory embodiments it can be a complex number such as (1-3i).

(ii) Then, an analogue waveform pattern AP is computed for each characteristic frequency CF by taking the inverse-discrete-Fourier transform (IDFT) of the spectrum S. Namely AP=IDFT(S). The vector AP contains M analog amplitude sample values.

(iii) Finally, the analogue waveform pattern is digitized to form an initial bit-pattern IBP with M binary values representing the characteristic frequency CF. This can be carried out for example utilizing the following conversion formula:

$$IBP_i = \text{Floor}\left(\frac{AP_i - \text{Min}(AP)}{\text{Max}(AP) - \text{Min}(AP)} + \frac{1}{2}\right)$$

where Floor(x) is a function returning the integer part of the value x, and Min(AP) and Max(AP) return the minimum and maximum values of the vector AP respectively.

Indeed, processing the initial bit patterns in the manner described in 32, provides that each initial bit pattern represents a rectangular waveform which when serialized with suitable sampling clock frequency $F_{SC}$, generated a rectangular waveform signal with prominent frequency at CF. However, as noted above, the frequency contents of such rectangular waveforms may include spurious frequency components which cannot be adequately filtered for obtaining sinusoidal signal with an acceptable SFR. That is the SFFB of such rectangular waveforms may be too narrow to accommodate a pass-band of a practical filter.

This is solved according to the invention by utilizing an additional step, 33, in which at least some of the initial bit patterns IBPs are modified to form a corresponding set of optimized bit-patterns OBPs allowing generation of substantially pure sinusoidal signal which doesn't contain spurious frequency components whose amplitude/power is above a certain threshold (i.e. with sufficiently high SFR). Actually, each one of the optimized bit-patterns is formed such that, when serialized, it provides a signal with a spurious free frequency band (SFFB) accommodating the pass band of a corresponding filter which is used to filter the signal. Accordingly, the optimized bit-patterns OBPs allow generation of substantially pure sinusoidal signals.

It should be noted, that for some spatial/canonical cases, certain initial bit patterns serve as the optimized bit patterns without modification. Specifically, these canonical bit-patterns are bit-patterns, for which a division of their characteristic frequency CF by the frequency step FSTEP is an integer-power of two: $CF/FSTEP=2^X$ (X being an integer value). Equivalently or alternatively these canonical bit-patterns are formed as $2^x$ periods of a repetitive sequence of Y bits in a first logical state followed by the same count of Y bits of opposite state. This is because the DFT spectrum of such canonical bit-patterns contains only its characteristic frequency CF and its odd harmonics thus a signal synthesized by serializing such pattern will have a wide spurious free frequency band (SFFB). This is however not so in the general case of initial bit-pattern IBP for which the ratio CF/FSTEP is not a factor of 2. Initial bit-pattern IBP, for which the ratio CF/FSTEP is not a factor of 2, typically requires further modification/optimization in order to allow production of a signal with sufficiently wide SFFB.

In practice, in step 33 part A, the initial bit patterns (or at least some of them) may be modified using various numerical or analytic mathematical techniques to generate optimized bit-patterns OBPs. At least some of the initial bit patterns IBPs are modified to form a set of optimized bit-patterns OBPs which have acceptably high spurious free range (SFR) within an the un-filterable-frequency-band surrounding their characteristic frequency (e.g. being the pass-band of the respective filter). Modification of the initial bit-patterns may be performed by considering the effects of bit-flips on the frequency contents of the initial bit-patterns. Optimized bit-patterns OBPs are then generated by applying selected bit-flip modifications, which provide sufficiently high spurious free ranges (SFR) in a desired spurious free frequency band (SFFB).

In some cases, it is desired to reduce the number of filters that are required for the generating signals of with multiple characteristic-frequencies CFs. Optionally, for such cases, the set of optimized frequency patterns OBPs are further modified to reduce the number of filters required and allow use of small set of filters.

Hence, optionally, according to some embodiments of the invention, modification of the bit patterns in step 33 also includes part B which may be performed concurrently or not with part A. In optional part B, the modification of the bit patterns is aimed at reducing the number of filtration bands to be implemented by filtration module 14 of FIG. 1A. This is performed by modifying the bit patterns in propose of widening and consolidating their SFFBs. Such modification allows filtration of signals of two or more optimized bit-patterns, utilizing a single frequency filter FTR thus reducing the number of required filters. Actually, each two or more optimized bit-patterns, which utilize a common filter, are modified in step 33-B such that their spurious free frequency bands (SFFBs) accommodate/overlay the pass-band of the filter.

Finally, by operating method 30, a set of optimized bit-patterns OBPs of length M with characteristic frequencies CFs are provided having acceptably high Spurious free range (SFR). Optionally, the set of optimized bit-patterns OBPs is also optimized to enable use of a smaller set of filters, in which the number of filters is less than the number of optimized bit-patterns in the set OBPs.

As noted above, the optimized bit-patterns OBPs produced according to method 30, can be generated in advance (e.g. by an external module or during initialization of the DDS) and stored by the wave-pattern module 12 of FIG. 1A or they might be generated on the fly by the wave-pattern module 12. In the latter case step 31, in which the number of bits M and the sampling clock frequency $F_{SC}$ are calculated, may be performed in the scope of the wave-pattern module 12 or in advance (e.g. not in the scope of system 10) to provide the number of bits M and the frequency $F_{SC}$ of the sampling clock. Also, steps 32 and 33 may be adapted to generate optimized bit-patterns, one at a time, in accordance with a selected/desired characteristic-frequency CF to be synthesized.

Following the above described technique, it should be understood that the set of characteristic frequencies CFs for which the optimized bit-patterns OBPs are designed are not necessarily identical to the set of final frequencies FFs to be synthesized by the system. This is because according to the invention, additional frequency conversion/multiplication operations might be carried out (e.g. by module 15 described above with reference to FIG. 1A) to obtain a final output frequency FF.

Figure 2B:
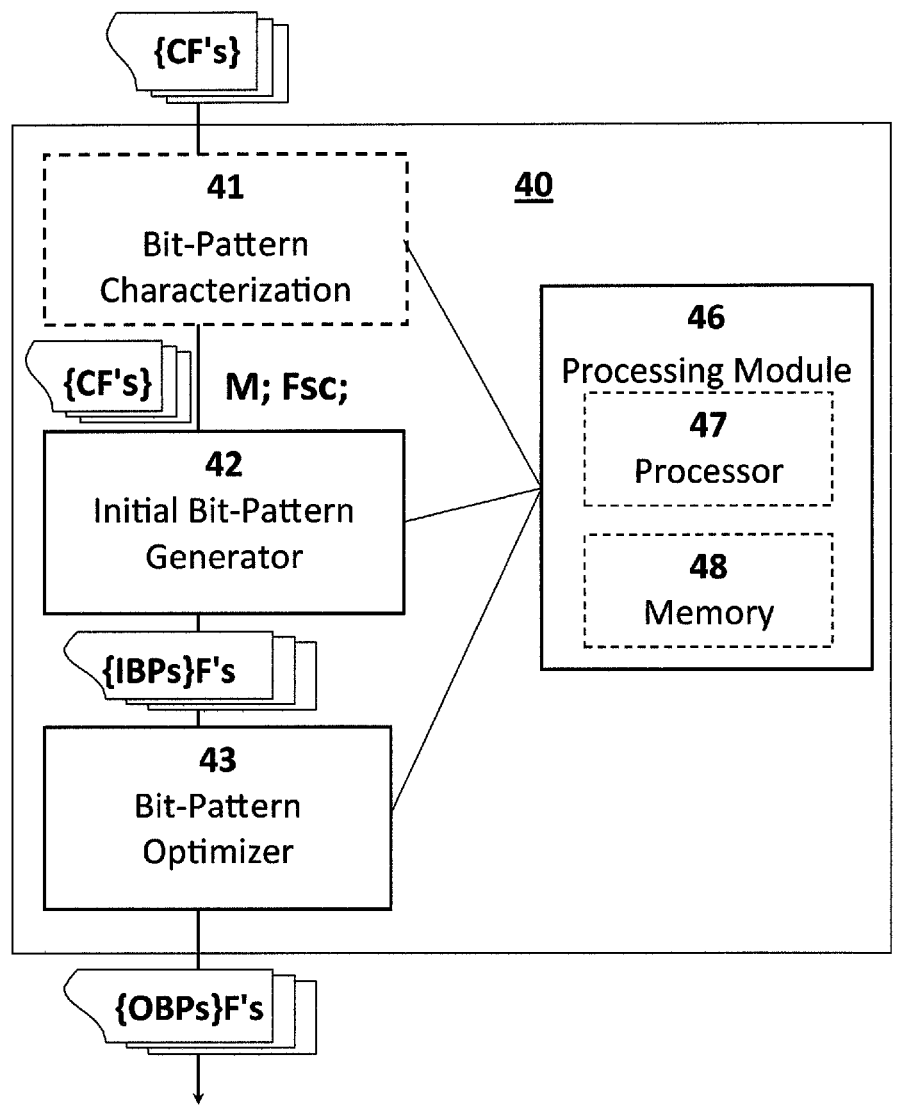

FIG. 2B illustrates schematically, a system 40 which is configured and operable for generating optimized bit-patterns OBPs in accordance with method 30 above. System 40 includes a processing module 46 (e.g. a computerized system) including for example a processor unit 47 (e.g. DSP) and possibly also memory unit 48. System 40 also includes a Bit-Pattern Characterization module 41, an Initial Bit-Pattern Generator module 42 and a Bit-Pattern Optimizer module 43. Modules 41, 42 and 43 are configured and operable for utilizing the processing module 46 and for implementing and executing the operations described above with reference to steps 31, 32 and 33 of method 30 respectively. Accordingly, the configuration and operation of these modules should be appreciated in view of the description of these method steps. It should be noted that the system 40 may be a suitably programmed computer or a computer program being readable by a computer for executing the method 30 of FIG. 2A. This includes a machine-readable memory tangibly embodying a program of instructions executing the method 30.

It is appreciated that bit-pattern characterization module 41 is an optional module which may be redundant in some embodiments of the invention. For example module 41 may be obviated in cases where system 40 is implemented in the Wave-Pattern Module 12 of FIG. 1 for on-the-fly bit pattern generation. In such cases, instead of module 41, a hard coded bit-length value M might be utilized by module 42 for generating the initial bit-patterns.

Figure 3A:
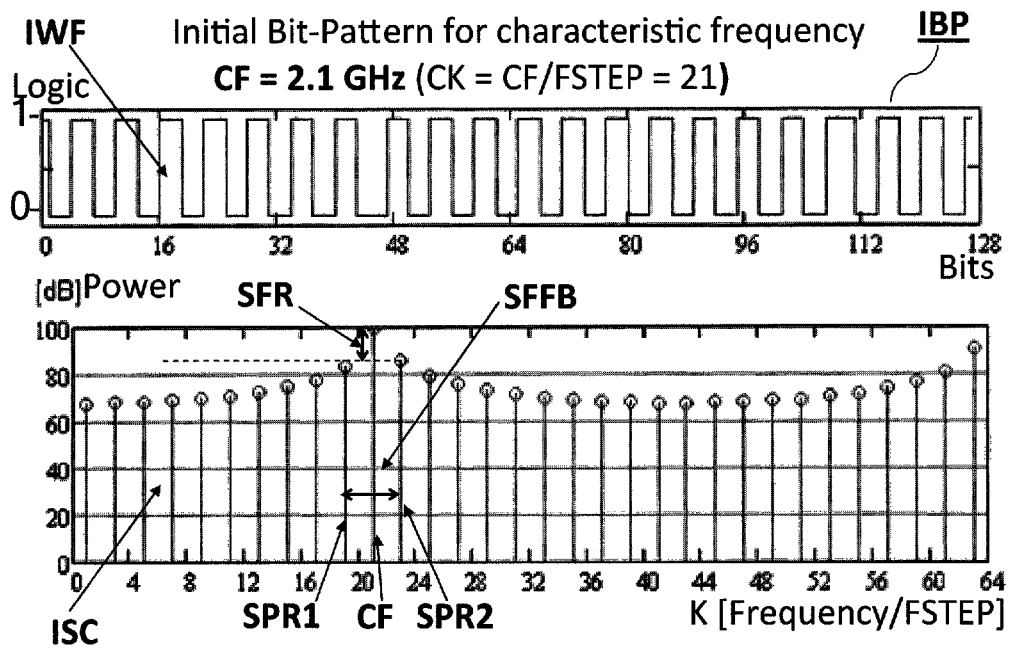
FIGS. 3A and 3B are graphical illustration of the waveforms and the spectrums of initial and optimized bit-patterns with characteristic frequencies of 2.1 GHz. The figures illustrate the widening of the bit-pattern's SFFB obtained by the optimization.
Figure 3B:
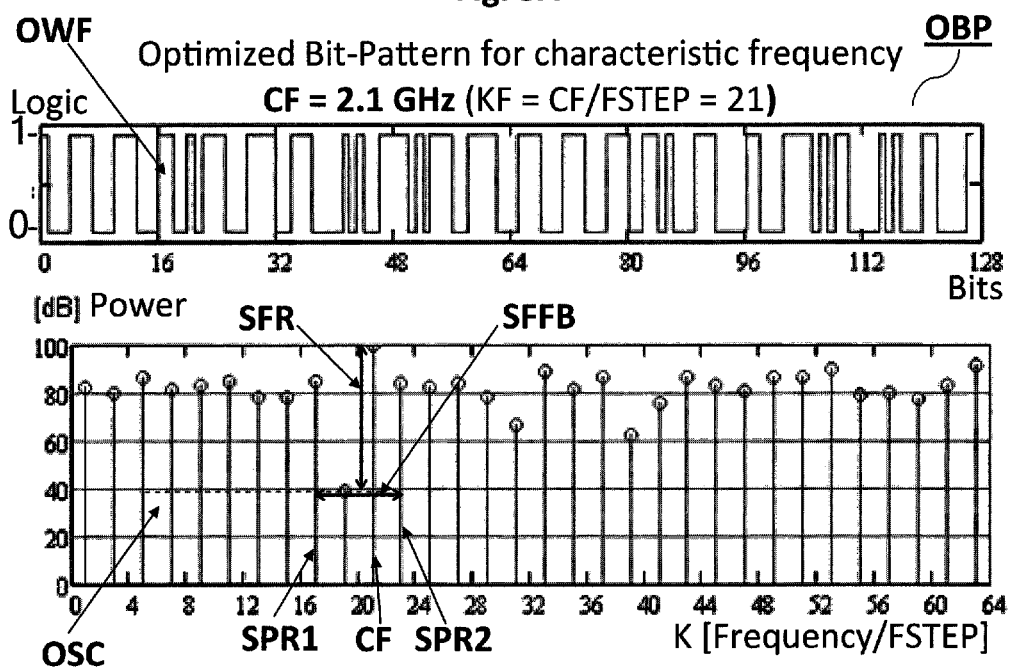

Reference is made now to FIGS. 3A and 3B respectively illustrating the waveforms and spectra of an initial bit-pattern IBP and a corresponding optimized bit pattern OBP which are generated utilizing method 30 described above. The optimized bit pattern OBP may be utilized by system 10 of FIG. 1A to synthesize signals with characteristic frequency CF of 2.1 GHz. In the following description of FIGS. 3A and 3B, references will also be made to elements of system 10 described in FIG. 1A and to steps of method 30 described in FIG. 2.

First, note that the length M of the bit-patterns IBP and OBP in the example of FIGS. 3A and 3B is selected based on the desired set of frequencies CFs to be synthesized and according to the frequency $F_{SC}$ of a sampling clock utilized. In this example, an embodiment of system 10 is considered, adapted for synthesizing signals with a characteristic frequencies CFs starting at 0.5 GHz and ranging up to 6 GHz at 0.1 GHz increments. The embodiment of system 10 considered here does not utilize frequency conversion module 15 and thus the set CFs is identical in this case to the output frequencies FFs. Also serializer module 13 of system 10 is considered here with sampling clock frequency $F_{SC}$=12.8 GHz and the desired SFR is 60 dB or better.

Based on step 31 of method 30, the length M of the bit patterns is computed as follows. A frequency step FSTEP=0.1 GHz is computed, being the largest common factor of the characteristic frequencies CFs, and the length M is selected as an integer N multiple of the sampling clock frequency $F_{SC}$ divided by the frequency step FSTEP. Namely M=N*$F_{SC}$/FSTEP=N*12.8 GHz/0.1 GHz=128*N bits. In this example N is selected as 1 and thus bit-patterns length M=128 bits is used (e.g. stored/generated by wave-module 12).

The initial IBP and optimized OBP bit-patterns, formed with respect to steps 32 and 33 of the above described method 30, are illustrated respectively in FIGS. 3A and 3B. These bit-pattern are suited for generating a signal with characteristic frequency CF=2.1 GHz and are represented by the respective shapes of their waveforms, marked IWF and OWF. Each of the waveforms IWF and OWF extends over 128 bits and ranges between logical false (0) and logical true (1) values indicating the values of the bits in the bit-patterns. FIGS. 3A and 3B also illustrate the spectral contents marked ISC and OSC of the initial and optimized bit-patterns, computed using Discrete Fourier Transform (DFT) method as described above.

As shown in the example of FIG. 3A, the spectral contents of the initial bit patterns is normalized to a 100 dB peak value at the characteristic frequency CF=2.1 GHz (namely at K=21 where K indicates frequency divided by the frequency step: K=F/FSTEP). Nearest spurious frequencies (spurs) SPR1 and SPR2, which surround the characteristic frequency CF, are at 1.9 GHz and 2.3 GHz with relative powers of more than 60 dB (the desired SFR). A practical filter has a finite slope of increasing attenuation away from its pass band. Therefore, in order to attenuate the spurs at 1.9 GHz and 2.1 GHz to the level of the desired SFR (i.e. by additional 45 dB to 50 dB), a filter with pass-band narrower than the SFFB is used. Actually for such SFR, the SFFB of the initial bit pattern IBP is 1.9 GHz<SFFB<2.1 GHz.

Referring to FIG. 3B, by comparing the optimized waveform OWF of bit pattern OBP with the initial waveform IWF of FIG. 3A, it is evident that several bit-flips have being made to optimize the initial bit patterns. For example bit No. 96 was initially set to true (in bit-pattern IBP) and flipped to false (in the optimized bit-pattern OBP). In accordance with the modification of the optimized bit-pattern OBP, also its spectral content OSP is changed. Now, the relative power of spurious frequency SPR1 is suppressed to below 40 dB while the power of the characteristic frequency component is again normalized to 100 dB. This provides SFR of more than 60 dB (60=100-40) within an SFFB range of 1.7 GHz<SFFB<2.1 GHz. Accordingly, it becomes possible to utilize a practical band-pass filter, with wider band-pass, to filter a rectangular waveform signal serialized from the optimized bit-pattern OBP and to thereby generate sine signal with the frequency CF and the desired SFR.

It should be noted that the optimized bit pattern OBP represents only one specific possible modification which is suitable for use in certain embodiments of the invention. It should be understood that other modifications may also be performed based on various desired SFR to be obtained in the serialized signal and based on the desired SFFB range of the bit-pattern within which the desired SFR should be obtained. It should be also noted that although in this particular example only spur SPR1 is substantially suppressed, it is possible to obtain other optimized bit patterns in which alternative or additional spurs such as SPR2 are also suppressed.

The bit-pattern optimization exemplified in FIGS. 3A and 3B illustrates the results of step 33 part A of method 30 in FIG. 2. Actually part A of step 33 can be implemented such that it is applied independently to each initial bit-pattern IBP to obtain a corresponding optimized bit-pattern OBP. The second part (B) of step 33 is an optional part of method 30 which may be operated on several bit-patterns together, with a purpose of consolidating the frequency filters used for their filtration (operation which is also termed here and above as "consolidation of SFFBs"). This corresponds to manipulating the SFFB ranges of several bit-patterns such that the SFFBs overlay a sufficiently wide pass band which can be filtered by a single practical filter. This allows reduction in the number of required frequency filters/filtration-profiles FTRs. As noted above, part B of step 33 can be operated together with part A (e.g. within a single optimization routine) or after the optimization of part A is performed.

The results of the operation of step 33 part B are exemplified graphically in FIGS. 4A and 4B. In these figures, optimized bit-patterns OBPs for generating a set of characteristic frequencies ranging from 0.6 GHz and up to 3.6 GHz with increments of 0.1 GHz are considered. FIGS. 4A and 4B illustrate graphically the SFFB ranges of optimized bit patterns before and after the operation of part B of step 33. FIGS. 4A and 4B are in the form of frequency maps wherein the horizontal axis indicates the characteristic frequencies CFs of different optimized bit patterns OBPs and the vertical axis indicates the frequency contents (spurious frequency content) of each OBP. The spurious frequency contents of an OBP with certain characteristic frequency CF is indicated by designating the nearest spurious frequencies neighboring its characteristic frequency CF. Namely, each characteristic frequency CF of a certain optimized bit-pattern OBP is indicated with a squared bullet residing on the diagonal of the map. Spurious frequencies SPR1 and SPR2, which are respectively below and above a certain characteristic frequency CF corresponding thereto, are respectively indicated with circles and triangles located vertically above and below the squared bullets of the certain characteristic frequency CF.

FIG. 4A illustrates the spectral contents of the optimized bit patterns, prior to the operation of step 33 part B of method 30. The bit-patterns are optimized (i.e. utilizing step 33 part A) to provide 60 dB suppression of nearby spurious frequencies within an SFFB of 0.4 GHz wide. I.e. SFR of 60 dB is obtained within a 0.4 GHz band that surrounds the characteristic frequency CF of each optimized bit pattern.

Pass-bands, which suite filtering the 0.6 to 3.6 GHz signals generated by the bit-patterns OBPs, are illustrated in the figure by semi-transparent rectangles. As shown in the figure, the set of optimized bit-patterns OBPs obtained up to this stage require fourteen (14) different band-pass filters (i.e. 14 different pass-bands) FTRs to allow the generation of sinusoidal signals within 3 GHz band.

FIG. 4B illustrates the spectral contents of the optimized bit patterns OBPs after full optimization of their spectral responses is carried in accordance with parts A and B of step 33 while considering filtration efficiency. In this example 60 dB suppression of adjacent spurious is achieved while reducing the number of required pass-bands/filters to 8.

Figure 5:
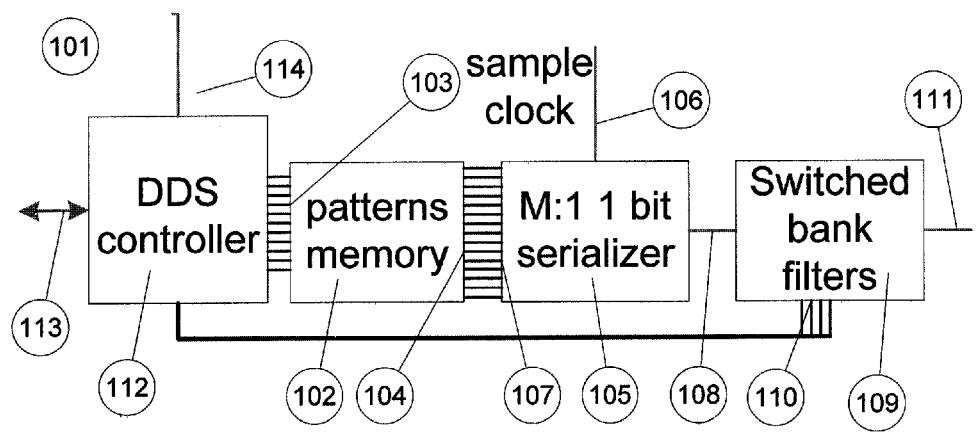
FIG. 5 is another embodiment of a DDS system according to the invention.

Reference is now made to FIG. 5 which is a schematic representation of direct digital synthesis system 101 according to another embodiment of the present invention. System 101 may be used for example for frequency selection and digital generation of phase coherent RF sine wave signals.

The system 101 uses patterns memory 102 being, for example, a digital binary data memory (i.e. serving as the wave-form module described above). The patterns memory 102 is loaded (e.g. in advance) with binary bit-patterns/sequences (also termed frequency patterns). Each binary bit-pattern in the patterns memory is useable by the system 101 for generating a certain characteristic signal frequency. Address signals 103 of the patterns memory are usable for selecting one of the bit-patterns that can be stored within, corresponding to a selected output signal frequency (FF). The patterns memory 102 may have a set of parallel output binary signals 104 presenting the frequency pattern selectable by its address signals as input signals to a serializer module 105. The serializer has a sample clock input 106, a number of digital data inputs 107 and a serial digital output 108. The serializer is configured for converting the parallel data of the frequency pattern to serial binary data at its output. The sample clock signal frequency ($F_{SC}$) should set the duration during which the serializer should output each of its data input signals at its serial digital output 108. The digital output signal from the serializer serves as the input signal to filtration module which is implemented here utilizing a switched bank filter 109. Switched bank filter 109 has filter selection control signals 110. The switched bank filter 109 is configured for attenuating substantially unwanted signal frequencies, while it should allow passage, without any substantial attenuation, of the selected signal frequency to the output channel 111. A controller 112 (also referred to, above, as frequency selector module) may accept, from time to time, selection of a signal frequency on its input control bus 113. The controller 112 is capable of setting the address signals of the patterns memory 102 and of the filter selection control signals of the switched bank filter 109 such that the system 101 may generate the selected signal frequency. The controller 112 has a clock signal input 114. According to the presented embodiment, phase coherency between output signals is achieved because the serializer is configured to maintain its input selection sequence for any frequency pattern selectable by the controller 112. In that sense all the frequency pattern waveforms are synchronized and switching between them produces coherent frequency signals.

Frequency-patterns (bit-patterns) are spectrally designed and optimized, using an analytic Discrete Fourier Transform (DFT) and/or numerical techniques, to produce a serial binary pattern corresponding to a substantially sinusoidal signal waveform 108. Each such sinusoidal signal waveform is characterized with frequency spectrum in which the amplitude of a single frequency, CF, is substantially higher than all other non-zero frequency signals, and where unwanted signal frequencies ("spurious signals") that are near CF on either side have acceptably low or zero amplitudes. Also the sinusoidal signal waveforms are designed and optimized such that the set of output signal frequencies can be filtered using a reduced (e.g. minimal) set of practical band pass filters in the switched bank filter 109. The output signal 108 of the serializer 105 is suitably buffered and connected to a switched bank filter 109.

Figure 6:
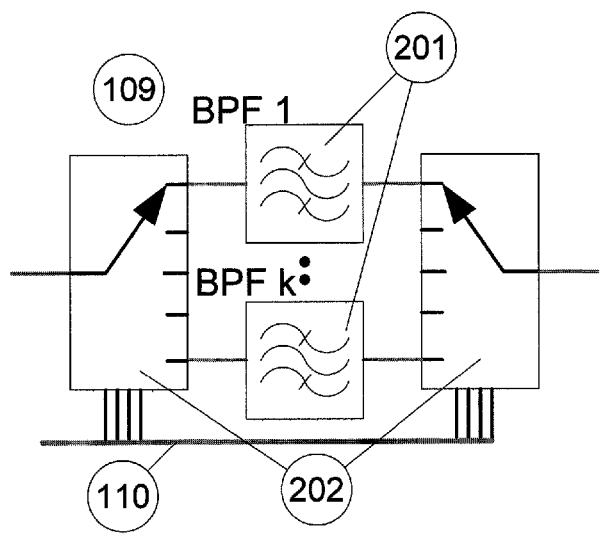
FIG. 6 illustrates an example of a filter bank module.

An embodiment of the switched bank filter is presented for example in FIG. 6. The switched bank filter includes a set of Band-Pass Filters (BPF) 201 with synchronized multi-pole radio frequency switches 202 on the input and output sides, such that the switches 202 can be set using their common controls 110 to insert any filter of the set of filters in the signal path. The switched-bank-filter is configured for filtering the frequency spectrum of the signal at its input and for passing a single frequency signal to its output substantially without attenuation while attenuating substantially any other frequency signals that are present at its input. Optimal selection of the set of frequency-patterns/bit-patterns produces a set of corresponding signal spectrums such that set of desired signals can be isolated using a minimum/reduced set of filters in the switched bank filter.

Figure 7A:
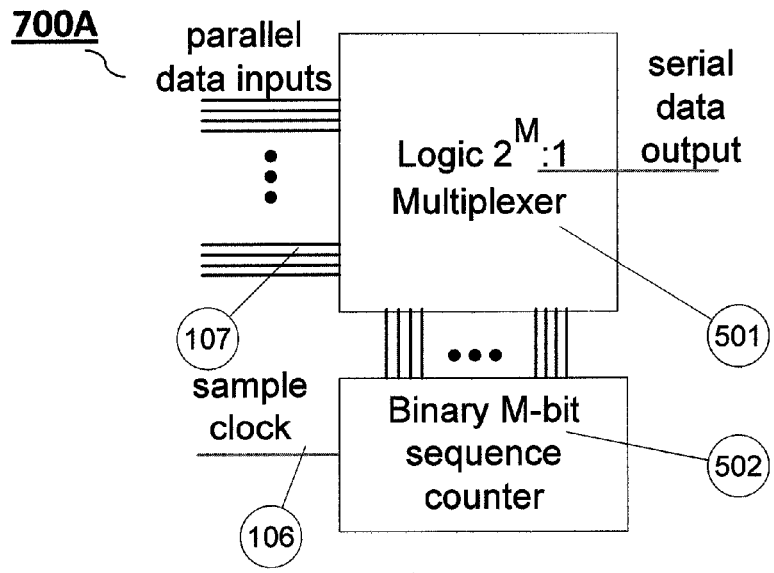
FIGS. 7A and 7B illustrate schematically two examples of a serializer module suited for use in certain embodiments of DDS systems of the invention.
Figure 7B:
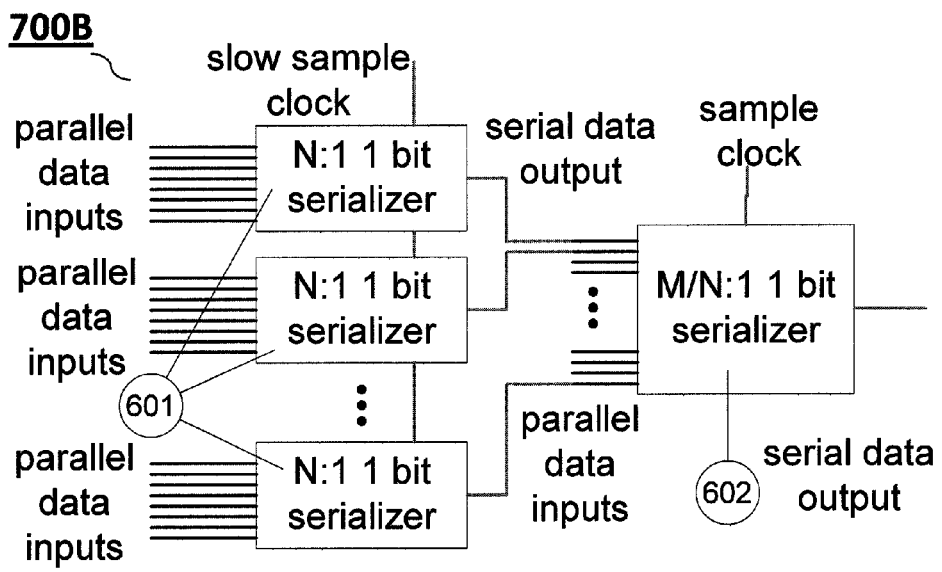

FIGS. 7A and 7B illustrate schematically two embodiments of serializer modules (e.g. 113 in FIG. 1A) which may be used in the present invention. It should be however appreciated that serializers are known in the art, and other serializers alternative to those illustrated and described bellow with reference to FIGS. 7A and 7B can also be used in embodiments of the present invention. This may include also off-the-shelf serializers, such as part number 2080MX® component produced by Inphi Corporation®.

A serializer module 700A is illustrated in FIG. 7A. The serializer includes a digital multiplexer 501 and sequence counter 502 that is connected thereto. The sequence counter 502 increments its count at the rate of the sample clock 106. When the sequence counter 502 reaches its maximum value it restarts its count. In this embodiment of the serializer, the digital multiplexer selects one of its input signals according to the instantaneous value (also referred to above as cyclic phase value) of the sequence counter. The counter has a number of count states that is equal to the number of input signals of the multiplexer. The serializer therefore sequentially selects individual bits from the frequency pattern signals present at its parallel data inputs and delivers the selected bit values to its serial output, one bit at a time, at a rate of the sample clock 106. Note that the position (e.g. coherent position) of the selected bit is determined independently form the selected frequency pattern (bit-pattern) which is present at the parallel data input of the serializer. Accordingly, coherent signal generation of obtained.

FIG. 7B presents another embodiment 700B of a serializer module, which uses a number of serializer components 601 that in turn use a slow sample clock ($F_{ssc}$) to serialize the frequency pattern data in interleaved parts. The serializer 700B also uses a final serializer 602 that combines the data streams from the serializer components 601 into a common serial output thereby producing the complete frequency pattern waveform.

It should be understood that the embodiment 700B of the serializer described above relates to a two-tier serializer. However, it should be appreciated that in accordance with some alternative or additional embodiments, three-tiers, four-tiers and other serializers may exist as well, wherein a third tier serializer (not illustrated in the figure) can combine data streams from at least one second tier serializer 602 and so forth. Hence, it can be generally expressed that the serializer 700B uses n tiers of serializers (n>=2), while at least one serializer of tier x (x<n) serial data output is connected to a serializer of tier X+1 parallel data input.

Figure 8:
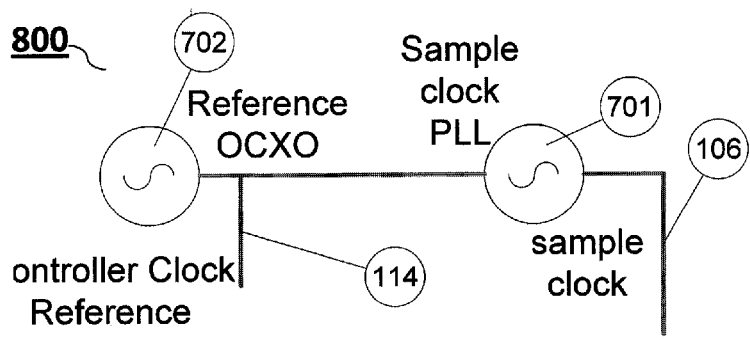
FIG. 8 illustrates an example of a sample clock signal generator according to an embodiment of the present invention.

Reference is made to FIG. 8 illustrating schematically a sample clock signal generator 800 according to an embodiment of the invention. The sample clock signal generator 800 may be utilized by embodiments of direct digital synthesis systems of the present invention for generating sampling clock signals 106 with desired sampling clock frequency $F_{SC}$.). The sample clock signal 106 is a digital signal that is produced by a stable and low-jitter digital clock Source. An embodiment of the sample clock signal is a signal generated by a low phase noise (and equivalently low-jitter) Phase Locked Loop (PLL) oscillator 701 that is phase locked to a reference signal 114 which is generated by an Oven stabilized Crystal Oscillator (OCXO) 702. The sampling clock signals may be used in the present invention by the serializer module(s) (e.g. as described above with reference to FIGS. 7A and 7B) to serialize the bit-patterns/frequency-patterns provided/ stored in the wave-pattern module (e.g. 12 in FIG. 1A). Accordingly the frequency of a sample clock signal 106, generated by the sample clock signal generator 800, is at least twice the highest sine-wave signal that is destined to be generate directly by the direct digital synthesis system (namely is at least twice the highest characteristic frequency of the bit-patterns provided by wave-form module 12 in FIG. 1A). In the embodiment of FIG. 5, the reference signal 114 of the sampling clock signal generator is also used to provide a clock signal to the controller/frequency selector 112.

Figure 9:
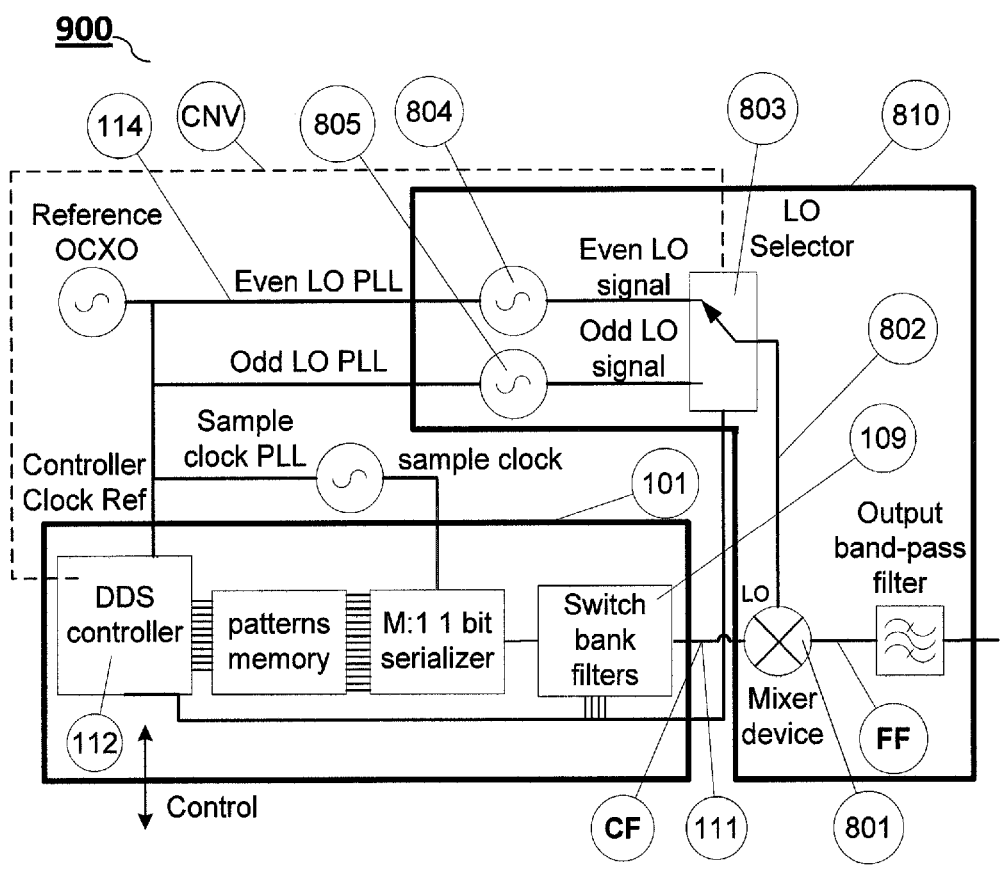
FIG. 9 is another embodiment of a DDS system according to the invention including a frequency conversion module.

Reference is now made to FIG. 9 in which a DDS system 900, according to another embodiment of the invention, is illustrated schematically. System 900 includes a DDS sub-system 101 similar to the system of FIG. 5 and a frequency conversion module 810 connected to the output of DDS sub-system 101. DDS sub-system 101 is adapted for providing an output signal 111 with frequency selected from a set of characteristic frequencies CFs. The frequency conversion module 810 is configured and operable for converting the frequency of signal 111 is accordance with a selectable conversion parameter CNV.

Frequency conversion module 810 includes a mixer device 801 which is configured and operable for applying frequency conversion to the output signal 111 of the DDS sub-system 101 by mixing the output signal 111 with selectable Local Oscillator (LO) signal 802. Frequency conversion module 810 also includes two local oscillators 804 and 805 providing "even" and "odd" LO signals which equal respectively to even and odd multiples of a frequency step (FSTEP) value being the maximal common factor of the characteristic frequencies CFs. The signals of local oscillators 804 and 805 may be generated for example by stable and low phase noise oscillators such as PLL oscillators. Both LO signals 804 and 805 are phase locked to the reference signal 114. It is appreciated that there are many ways in the art to generate and phase lock the LO signals 804 and 805 and any such way applicable to the case may be appropriate for this invention.

The selectable Local Oscillator (LO) signal 802 is selected by the controller 112 utilizing a switch unit 803 (e.g. an RF switch) which switches between local oscillators 804 and 805. The controller 112 (also referred to above as frequency selector module) is operable for selecting frequency conversion parameter CNV in accordance with the selected frequency to be synthesized and to accordingly switch between local oscillators 804 and 805.

In this embodiment the characteristic frequencies CFs provided by DDS sub-system 101 are limited to values of CF where the ratio CF/FSTEP is a factor of 2. This choice produces wider SFFB with lower level of spurious signals components within. The controller 112 of DDS sub-system 101 appropriately selects frequency conversion parameters CNV in accordance with the selected frequency FF to be synthesized: when the ratio FF/FSTEP is odd, the "Odd" LO signal is selected while even LO signal is used when FF/FSTEP is even. Accordingly, controller 112 activates the switch unit 803 to select the appropriate LO signal with frequency being an even or odd multiplication of FSTEP. Consequently, in this embodiment, the frequency response requirements from the filters 201 of the switched bank filter 109 are further substantially relaxed as the SFFB of the signals is substantially widens and/or their spurious signal free range (SFR) near the signal characteristic frequencies CFs is substantially increased.

While the present invention is susceptible to various modifications and alternative constructions, a certain illustrated embodiments thereof are shown in the drawings and have been described above in detail. It should be understood, however, that there is no intention to limit the invention to the specific form disclosed, but on the contrary, the intention is to cover all modifications, alternative constructions, and equivalents falling within the spirit and scope of the invention.

The invention claimed is:

1. A method for digital synthesis of electric signals, the method comprising:
   a. providing one or more bit-patterns, each indicative of a rectangular waveform having a characteristic frequency;
   b. determining a selected signal frequency to be synthesized and obtaining a selected bit-pattern associated therewith;
   c. cyclically serializing bits of said selected bit-pattern to generate a substantially rectangular waveform signal comprising said characteristic frequency; and
   d. filtering said signal to suppress spurious frequencies outside a certain unfiltered frequency band which corresponds to said selected bit-pattern to thereby obtain a filtered signal with prominent frequency component corresponding to said selected signal frequency,
   wherein a Fourier spectrum of said rectangular waveform is characterized in that a ratio between a spectral power of said characteristic frequency and spectral powers of other frequencies within said unfiltered frequency band is higher than a certain Spurious free range (SFR) to be obtained in said filtered signal.

2. A method for digital synthesis of electric signals, the method comprising:
   a. providing one or more bit-patterns, each indicative of a rectangular waveform having a characteristic frequency;
   b. determining a selected signal frequency to be synthesized and obtaining a selected bit-pattern associated therewith;
   c. cyclically serializing bits of said selected bit-pattern to generate a substantially rectangular waveform signal comprising said characteristic frequency; and
   d. filtering said signal to suppress spurious frequencies outside a certain unfiltered frequency band which corresponds to said selected bit-pattern to thereby obtain a filtered signal with prominent frequency component corresponding to said selected signal frequency,
   wherein said cyclic serialization of bits from said selected bit-pattern is performed by repeatedly determining a cyclic phase value and serializing a corresponding bit of said selected bit pattern.

3. The method according to claim 2, wherein said cyclic phase is determined independently from said selected signal frequency and its associated bit pattern, thereby enabling to revoke synthesis of a certain signal of a certain selected frequency and later on invoke synthesis of said certain signal while maintaining coherency of said certain signal.

4. The method according to claim 3 allowing synthesis of other signals during intermediate times between revoking and invoking synthesis of said certain signal.

5. The method according to claim 2, wherein said cyclic phase is determined utilizing a sampling clock.

6. The method according to claim 5, wherein said one or more bit patterns having an identical bit-length (M) that is equal to an integer multiple of a frequency Fsc (Sampling Clock Frequency) of said sampling clock divided by a largest common factor of a set of characteristic frequencies corresponding to said bit-patterns.

7. A method for digital synthesis of electric signals, the method comprising:
   providing one or more bit-patterns, each indicative of a rectangular waveform having a characteristic frequency;

b. determining a selected signal frequency to be synthesized and obtaining a selected bit-pattern associated therewith;

c. cyclically serializing bits of said selected bit-pattern to generate a substantially rectangular waveform signal comprising said characteristic frequency; and d filtering said signal to suppress spurious frequencies outside a certain unfiltered frequency band which corresponds to said selected bit-pattern to thereby obtain a filtered signal with prominent frequency component corresponding to said selected signal frequency, wherein said one or more bit patterns have an identical hit-length (M) and wherein at least one bit-pattern, indicative of a rectangular waveform having a characteristic frequency, is in a form of a modified series of M single-bit samples, sampled at fixed-intervals from a repeating waveform containing said characteristic frequency and said series is modified to suppress spurious frequencies within a certain unfiltered frequency band surrounding said characteristic frequency.

8. The method according to claim 7, wherein said bit-pattern is modified such that a difference between a power of said characteristic frequency and powers of said spurious frequencies is above a certain SFR threshold.

9. The method according to claim 7, wherein a modification of said bit-patterns is optimized to reduce a number of unfiltered frequency bands corresponding to said bit-patterns, thereby reducing a number of required filters.

10. A method for digital synthesis of electric signals, the method comprising:

a. providing, one or more bit-patterns, each indicative of a rectangular waveform having a characteristic frequency;

b. determining a selected signal frequency to be synthesized and obtaining a selected bit-pattern associated therewith;

c. cyclically serializing bits of said selected bit-pattern to generate a substantially rectangular waveform signal comprising said characteristic frequency; and d. filtering said signal to suppress spurious frequencies outside a certain unfiltered frequency band which corresponds to said selected bit-pattern to thereby obtain a filtered signal with a prominent frequency component corresponding to Said selected signal frequency, wherein said characteristic frequency and said prominent frequency are substantially equal to said selected signal frequency.

11. A method for digital synthesis of electric signals, the method comprising:

a. providing one or more bit-patterns, each indicative of a rectangular waveform having a characteristic frequency;

b. determining a selected signal frequency to be synthesized and obtaining a selected bit-pattern associated therewith;

c. cyclically serializing bits of said selected bit-pattern to generate a substantially rectangular waveform signal comprising said characteristic frequency;

d. filtering said signal to suppress spurious frequencies outside a certain unfiltered frequency band which corresponds to said selected bit-pattern to thereby obtain a filtered signal with a prominent frequency component corresponding to said selected signal frequency; and e. applying frequency up-conversion to said filtered signal to obtain a signal with said selected signal frequency.

12. A method for digital synthesis of electric signals, the method comprising:

a. providing one or more bit-patterns, each indicative of a rectangular waveform having a characteristic frequency;

b. determining a selected signal frequency to be synthesized and obtaining a selected bit-pattern associated therewith;

c. cyclically serializing bits of said selected bit-pattern to generate a substantially rectangular waveform signal comprising said characteristic frequency; and d. filtering said signal to suppress spurious frequencies outside a certain unfiltered frequency band which corresponds to said selected bit-pattern to thereby obtain a filtered signal with a prominent frequency component corresponding to said selected signal frequency, wherein a signal obtained from said selected bit-pattern is filtered utilizing a band pass filter selected according to the frequency associated with said bit-pattern.

13. The method according to claim 12, wherein said signal is filtered utilizing a filter bank and said band pass filter is selected from said filter bank.

14. A method for designing a frequency pattern including a sequence of bits, the frequency pattern represents sequential samples in time of a repeating waveform whose discrete Fourier transform defines a frequency spectrum, the frequency pattern waveform is filtered by a filter to produce a sine-wave signal having a characteristic frequency, the method comprising:

a. determining a number of bits included in said sequence of bits;

b. computing an initial frequency pattern including computing initial values for bits included in said sequence of bits;

c. evaluating the effect of bit flips in the initial frequency pattern, thereby creating a modified frequency pattern, applying discrete Fourier transform to the waveform represented by the modified frequency pattern and determining the amplitudes of frequencies in a resulting frequency spectrum; and d. selecting a frequency pattern that corresponds to a frequency spectrum having substantially high amplitude of the characteristic frequency while signal frequencies near the characteristic frequency have acceptably low amplitude levels.

* * * * *